United States Patent
Park et al.

(10) Patent No.: US 8,354,292 B2
(45) Date of Patent: Jan. 15, 2013

(54) CMOS IMAGE SENSOR HAVING A CROSSTALK PREVENTION STRUCTURE AND METHOD OF MANUFACTURING THE SAME

(75) Inventors: Won-Je Park, Yongin-si (KR); Young-Hoon Park, Suwon-si (KR); Ui-Sik Kim, Seongnam-si (KR); Dae-Cheol Seong, Seoul (KR); Yeo-Ju Yoon, Uijeongbu-si (KR); Bo-Bae Kang, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/413,137

(22) Filed: Mar. 6, 2012

(65) Prior Publication Data
US 2012/0164783 A1 Jun. 28, 2012

Related U.S. Application Data

(62) Division of application No. 12/482,960, filed on Jun. 11, 2009, now Pat. No. 8,138,530.

(30) Foreign Application Priority Data

Jun. 12, 2008 (KR) .................................. 2008-55187

(51) Int. Cl.
*H01L 21/339* (2006.01)

(52) U.S. Cl. ............ 438/60; 438/75; 438/144; 257/291; 257/292; 257/401; 257/390; 257/389; 257/375; 257/368; 257/262

(58) Field of Classification Search .................. 257/262, 257/368, 375, 389, 390, 401, 291, 292; 438/60, 438/75, 144
See application file for complete search history.

(56) References Cited

U.S. PATENT DOCUMENTS

| | | | | |
|---|---|---|---|---|
| 5,847,381 A | * | 12/1998 | Isogai | 250/208.1 |
| 6,403,998 B1 | * | 6/2002 | Inoue | 257/292 |
| 6,504,194 B1 | * | 1/2003 | Miida | 257/292 |
| 6,815,743 B2 | * | 11/2004 | Rhodes | 257/292 |
| 6,852,565 B1 | | 2/2005 | Zhao | |
| 7,038,259 B2 | * | 5/2006 | Rhodes | 257/258 |
| 7,164,447 B2 | * | 1/2007 | Takahashi | 348/350 |
| 7,294,873 B2 | * | 11/2007 | Suzuki et al. | 257/225 |
| 7,342,211 B2 | * | 3/2008 | Park et al. | 250/208.1 |

(Continued)

FOREIGN PATENT DOCUMENTS

KR 10-0714484 4/2007

(Continued)

*Primary Examiner* — Marc Armand
*Assistant Examiner* — Bilkis Jahan
(74) *Attorney, Agent, or Firm* — F. Chau & Associates, LLC

(57) ABSTRACT

In a method of manufacturing a CMOS image sensor, a P type epitaxial layer is formed on an N type substrate. A deep P+ type well layer is formed in the P type epitaxial layer. An N type deep guardring well is formed in a photodiode guardring region. The N type deep guardring region makes contact with the N type substrate and also be connected with an operational voltage terminal. A triple well is formed in a photodiode region and a peripheral circuit region. The triple well is used for forming a PMOS and an NMOS having different operational voltages. An isolation region is formed in the photodiode region. The isolation region in the photodiode region has a depth different from a depth of an isolation region in the peripheral circuit region.

8 Claims, 26 Drawing Sheets

U.S. PATENT DOCUMENTS

| | | | |
|---|---|---|---|
| 7,687,837 B2 * | 3/2010 | Park et al. | 257/294 |
| 2002/0050593 A1 | 5/2002 | Fukunaga et al. | |
| 2006/0084195 A1 | 4/2006 | Lyu | |
| 2006/0220025 A1 * | 10/2006 | Oh | 257/72 |
| 2007/0029637 A1 * | 2/2007 | Rhodes et al. | 257/510 |
| 2007/0194356 A1 * | 8/2007 | Moon et al. | 257/291 |
| 2009/0008688 A1 * | 1/2009 | Park et al. | 257/292 |

FOREIGN PATENT DOCUMENTS

| | | |
|---|---|---|
| KR | 10-0809322 | 2/2008 |

\* cited by examiner

CMOS IMAGE SENSOR HAVING A CROSSTALK PREVENTION STRUCTURE AND METHOD OF MANUFACTURING THE SAME

CROSS-REFERENCE TO RELATED APPLICATION

This application is a divisional of U.S. patent application Ser. No. 12/482,960 filed on Jun. 11, 2009 now U.S. Pat. No. 8,138,530, which claims priority to and the benefit of Korean Patent Application No. 2008-55187, filed on Jun. 12, 2008 in the Korean Intellectual Property Office (KIPO), the entire contents of which are incorporated by reference herein.

BACKGROUND

1. Field of the Invention

The present disclosure relates to sensors, and, more particularly, to CMOS image sensors and a method of manufacturing the same.

2. Discussion of the Related Art

Generally, image sensors convert an optical image into an electrical signal. Recently, as the information communication industry and digital electronic devices have developed, image sensors are being widely used in diverse fields such as digital cameras, camcorders, cellular phones, personal communication systems, game devices, guard cameras, medical micro cameras, etc.

Typically, when the degree of integration of a pixel in an image sensor is increased to improve the resolution of the image sensor, the sensitivity of the image sensor is decreased due to the small volume of the photoelectric transforming element, for example, a photodiode of a unit pixel.

As semiconductor devices become highly integrated, the area of a unit cell has decreased. However, the requirement for highly integrating the semiconductor device may produce a short distance between adjacent pixels, so that crosstalk is frequently generated.

A conventional CMOS image sensor includes a unit cell having a photodiode region and a peripheral circuit region on a semiconductor substrate. Optical crosstalk and/or electrical crosstalk is generated in the conventional CMOS image sensor cell. The optical crosstalk is generated by the refraction of light which is incident to the cell through a micro lens on insulating interlayers having different refractivities or a layer having uneven surface. The electrical crosstalk is generated by electrons thermally created outside of a depletion region in the semiconductor substrate. The optical crosstalk and/or the electrical crosstalk can cause a low resolution and a distorted image of the conventional image sensor.

When the conventional image sensor is produced, the gap between the pixels of the image sensor can be quite narrow and result in the image sensor malfunctioning due to crosstalk.

Recently, with the development of the information communication industry and of digital electronic devices in general, highly improved image sensors are widely used in diverse fields such as digital cameras, camcorders, cellular phones, personal communication systems, game devices, guard cameras, medical micro cameras, etc. Further, since semiconductor devices have become highly integrated, the area of a unit cell in the semiconductor device has become greatly reduced, so that the width of patterns and the gap between patterns has narrowed. In contrast, the semiconductor devices still require good electrical characteristics and low power consumption in spite of the small area of the unit cell.

A conventional image sensor cell includes an active pixel sensor (APS) array region which includes a photodiode region and a peripheral circuit region.

A CMOS image sensor includes a peripheral circuit and a photodiode having a CMOS cell structure by forming an epitaxial layer on a P type substrate. Light which is incident to the cell through a micro lens is refracted from insulating interlayers having different refractivities or a layer having uneven surface to generate an optical crosstalk. Further, electrons which are thermally created outside of the depletion region in the semiconductor substrate diffuse in various directions because an electric field does not exist. The electrons can accumulate in the pixel and generate electrical crosstalk. The optical crosstalk and/or the electrical crosstalk cause low resolution and a distorted image of the conventional image sensor.

Because the conventional image sensor includes a P type substrate, although having good sensitivity, the conventional image sensor has inferior characteristics with respect to dark current (i.e, the relatively small electric current that flows through a photosensitive device when no photons are entering the device) and crosstalk. In contrast, when an N type substrate is used, a voltage of the N type substrate is controlled through an operational voltage terminal. Thus, the thermal electron hole pair which is generated outside of the depletion region in the semiconductor substrate does not diffuse in various directions. The thermal electron is drained through the operational voltage terminal. The hole is drained through a ground terminal.

When the P type substrate is used, there is not an exit passageway through which the thermal electrons can pass and the thermal electrons accumulate in the photodiode.

SUMMARY

In accordance with exemplary embodiments of the present invention a CMOS image sensor is provided which is capable of preventing optical and electrical crosstalk by forming a deep well region in a photodiode guardring region and using an N type substrate to form a drain passageway for thermal electrons which are generated outside of a depletion region to an operational voltage terminal, and by forming an isolation structure of a photodiode region deeper than a peripheral circuit region.

Exemplary embodiments also provide a semiconductor device that has a structure for preventing electrical crosstalk by forming a deep well, which makes contact with an operational voltage terminal, in a photodiode guardring region of a CMOS image sensor to form a drain passageway of thermal electrons generated in a substrate.

Exemplary embodiments also provide a method of manufacturing a CMOS image sensor that has a high integration degree, low crosstalk, low dark current, and low noise by forming an isolation region of a photodiode region deeper than a peripheral circuit region for allowing refractive light which is generated in a pixel, to accumulate in the pixel and also prevent an accumulation in an adjacent pixel.

Exemplary embodiments also provide a method of manufacturing a system using the above-mentioned device.

Exemplary embodiments also provide a drain passageway of thermal electron hole pairs, which are generated in a substrate, to a ground terminal or an operation voltage terminal by forming a P type epitaxial layer on an N type substrate, and forming a P+ type well region, which functions as an isolation layer between the N type substrate and a deep N type well region in a peripheral circuit, in the P type epitaxial layer to reduce the resistance of a P type epitaxial layer on an N type substrate.

According to an exemplary embodiment, there is provided a method of manufacturing a CMOS image sensor wherein a P type epitaxial layer is formed on an N type substrate. A deep $P^+$ type well layer is formed in the P type epitaxial layer. An N type deep guardring well is formed in a photodiode guardring region. The N type deep guardring region makes contact with the N type substrate and is also connected with an operational voltage terminal. A triple well is formed in a photodiode region and a peripheral circuit region. The triple well is used for forming a PMOS and an NMOS having different operational voltages. An isolation region is formed in the photodiode region. The isolation region in the photodiode region has a depth different from that of an isolation region in the peripheral circuit region.

According to an exemplary embodiment, there is provided a method of manufacturing a CMOS image sensor wherein a P type epitaxial layer is formed on an N type substrate. An N type deep guardring well is formed in a photodiode guardring region. The N type deep guardring region makes contact with the N type substrate and also be connected with an operational voltage terminal. A triple well is formed in a photodiode region and a peripheral circuit region. The triple well is used for forming a PMOS and an NMOS having different operational voltages. A P type deep well is formed under the triple well. An isolation region is formed in the photodiode region. The isolation region in the photodiode region has a depth different from that of an isolation region in the peripheral circuit region.

According to an exemplary embodiment, there is provided a method of manufacturing a CMOS image sensor wherein a $P^+$ type epitaxial layer is formed on an N type substrate. A $P^-$ type epitaxial layer is formed in the $P^+$ type epitaxial layer. An N type deep guardring well is formed in a photodiode guardring region. The N type deep guardring region makes contact with the N type substrate and also be connected with an operational voltage terminal. A triple well is formed in a photodiode region and a peripheral circuit region. The triple well is used for forming a PMOS and an NMOS having different operational voltages. An isolation region is formed in the photodiode region. The isolation region in the photodiode region has a depth different from that of an isolation region in the peripheral circuit region.

According to an exemplary embodiment, there is provided a CMOS image sensor that has an isolation region configured to accumulate refractive light, which is generated in a pixel, in the pixel. Further, the CMOS image sensor has an electrical drain passageway of thermal electron hole pairs, which is generated in an outside of a depletion region, to an operational voltage terminal and a ground terminal. Thus, the CMOS image sensor has a minute cell structure without crosstalk, a dark current and a noise.

According to an exemplary embodiment, the deep isolation region between the photodiodes is formed under the depletion region to prevent the refractive light generated in the pixel from being accumulated in an adjacent pixel. Further, the electrical drain passageway of the thermal electron hole pairs generated outside of the depletion region is connected to the operational voltage terminal and the ground terminal. As a result, the CMOS image sensor has low crosstalk, low dark current and low noise.

Further, the $P^+$ type deep well layer having a low resistance is formed in the $P^+$ type epitaxial layer on the N type substrate. Thus, the CMOS image sensor has improved drain capacity to prevent an increase of a body potential by the accumulation of the holes and improve a shading image. As a result, the CMOS image sensor has improved sensitivity.

Furthermore, the CMOS image sensor without the crosstalk has a large storage capacity. In contrast, the CMOS image sensor has a small size. Therefore, a large amount of cells can be formed in the substrate to obtain a highly integrated image sensor device. As a result, the device can be applied to various digital systems to manufacture digital goods having a high resolution.

BRIEF DESCRIPTION OF THE DRAWINGS

Exemplary embodiments will be more clearly understood from the following detailed description taken in conjunction with the accompanying drawings.

DETAILED DESCRIPTION OF THE EXEMPLARY EMBODIMENTS

Figure 1:
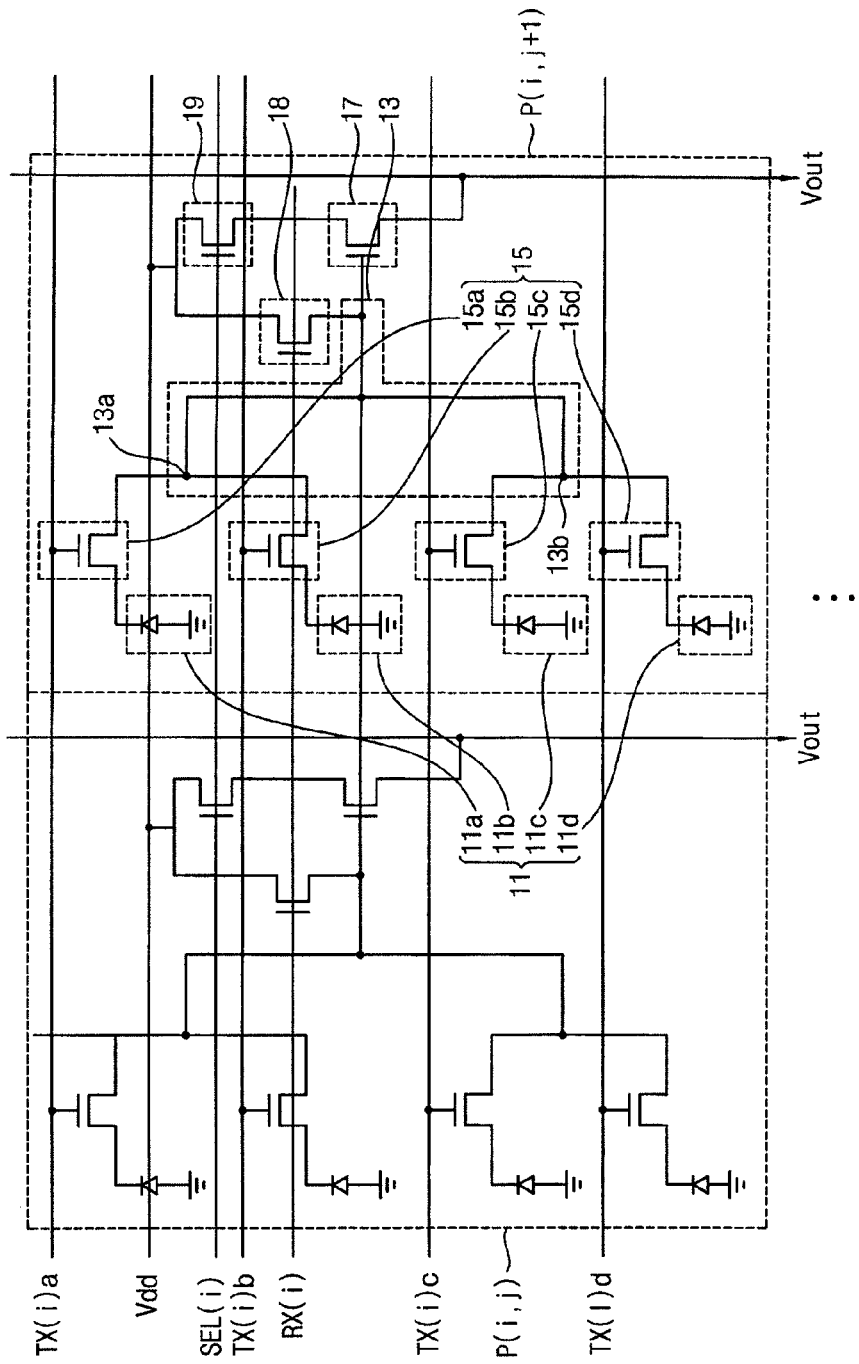
FIG. 1 is an equivalent circuit diagram illustrating a four-shared type active pixel array.

Various exemplary embodiments will be described more fully hereinafter with reference to the accompanying drawings, in which exemplary embodiments are shown. The present invention may, however, be embodied in many different forms and should not be construed as limited to the exemplary embodiments set forth herein. In the drawings, the sizes and relative sizes of layers and regions are exaggerated for clarity.

It will be understood that when an element or layer is referred to as being "on," "connected to" or "coupled to" another element or layer, it can be directly on, connected or coupled to the other element or layer or intervening elements or layers can be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. are used herein to describe various elements, components, regions, layers and/or sections, these elements, components, regions, layers and/or sections should not be limited by these terms. These terms are used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

FIG. 1 is an equivalent circuit diagram illustrating a four-shared type active pixel array. The four-shared type pixel P includes four photodiodes 11 (11a, 11b, 11c, 11d). A unit pixel includes a floating diffusion region 13 and a plurality of read-out elements for reading out charges accumulated in the photodiodes 11. The read-out elements include a selection element 19, a drive element 17 and a reset element 18.

The four-shared type pixel P allows the four photodiodes 11 to commonly control the selection element 19, the drive element 17 and the reset element 18. The structure and number of the photodiodes can vary in accordance with requirements and characteristics of devices. The four photodiodes 11 are coupled to transmission elements 15 (15a, 15b, 15c, 15d), respectively, for transmitting the charges to the floating diffusion region 13. The photodiodes 11 commonly control the drive element 17, the reset element 18 and the selection element 19.

The drive element 17 amplifies the electrical potential difference of the floating diffusion region 13 in which the charges are accumulated. The drive element 17 then outputs the amplified electrical potential difference to an output line Vout. The reset element 18 periodically resets the floating diffusion region 13 to a reference value. The reset element 18 corresponds to a transistor driven by a bias that is supplied through a reset line RX(i). The bias supplied through the reset line RX(i) turns on the reset element 18, so that an electrical potential such as a power voltage Vdd supplied to a drain of the reset element 18 can be transmitted to the floating diffusion region 13. The selection element 19 selects any one of the pixels P to be read row by a row.

Transmission lines TX(i)a, TX(i)b, TX(i)c, TX(i)d for applying the bias to the transmission elements 15, the reset line RX(i) for applying the bias to the reset element 18, and a row selection line SEL(i) for applying the bias to the selection element 19, are arranged in parallel with one another along a row direction.

Figure 2:
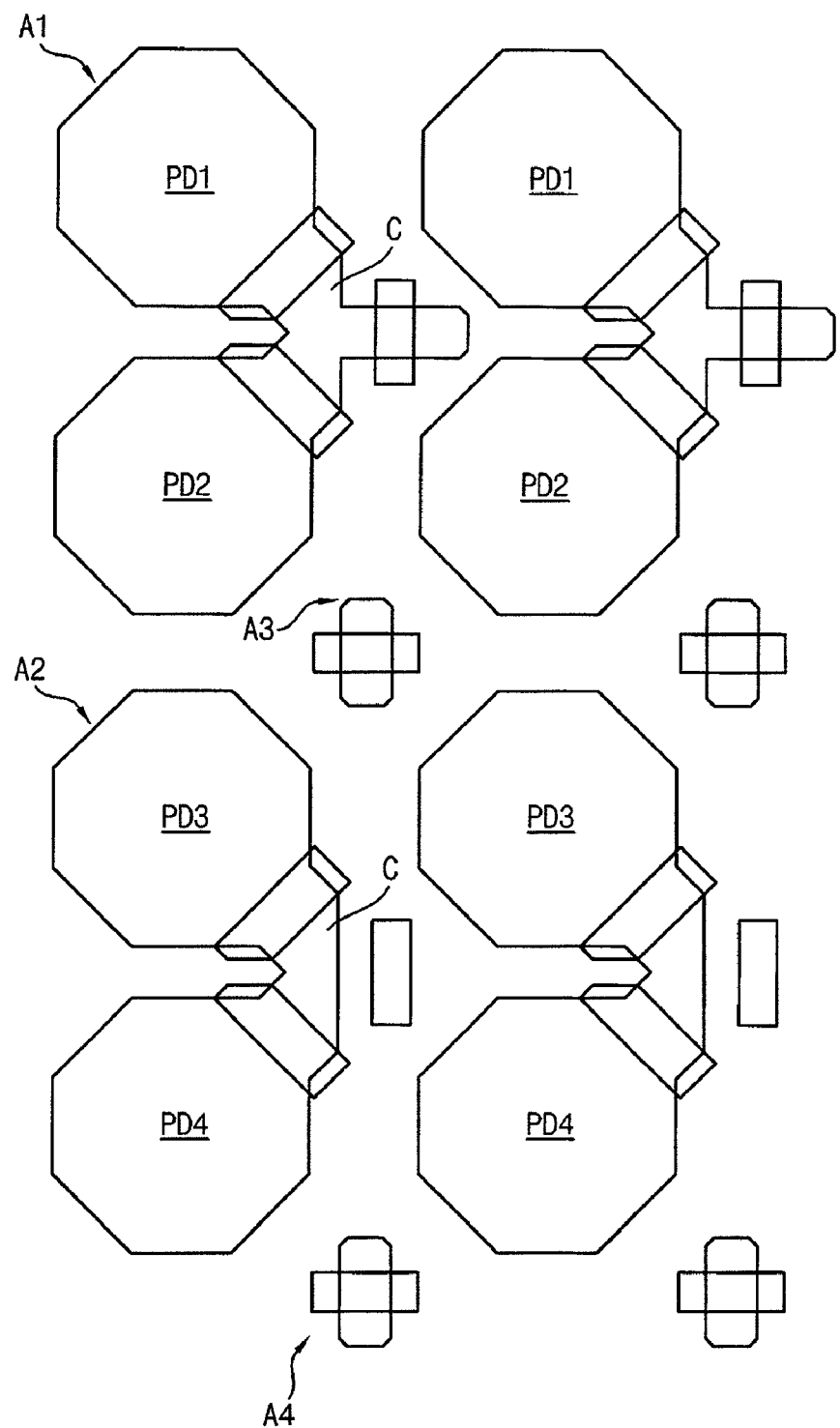
FIG. 2 is a layout illustrating the four-shared type pixel array.

FIG. 2 is a layout illustrating the four-shared type pixel array. The four-shared type active pixel sensor array includes a first active region A1 commonly controlling two photodiodes PD1, PD2, and second active region A2 commonly controlling another two photodiodes PD3, PD4. The first active region A1 and the second active region A2 are repeatedly arranged in a matrix shape. A pair of the first active region A1 and the second active region A2 includes a third active region A3 and a fourth active region A4 as two independent read-out active regions.

Figure 3:
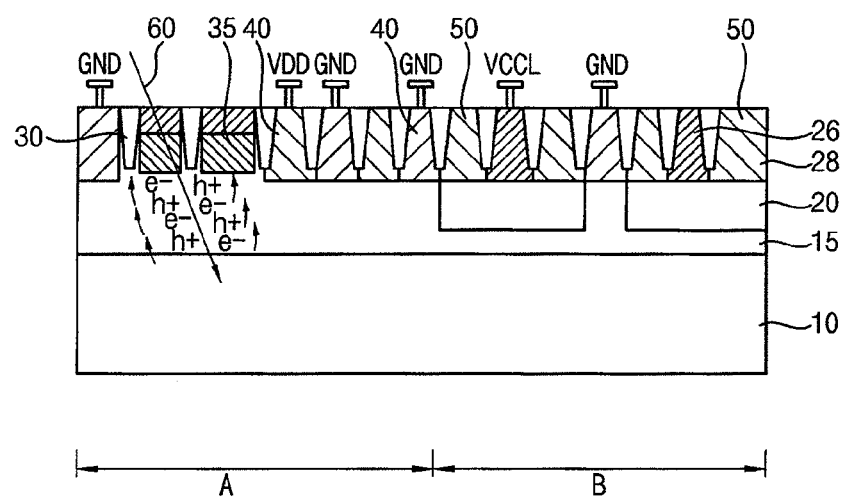
FIG. 3 is a cross-sectional view illustrating a CMOS image sensor.

FIG. 3 is a cross-sectional view illustrating a CMOS image sensor. A P type epitaxial layer 15 is formed on a P type semiconductor substrate 10 to form the active pixel sensor array, a photodiode 35 and a sharing circuit 40 such as the selection element, the drive element and the reset element in a circuit region A, and a peripheral circuit 50 in a peripheral circuit region B.

Isolation layers 30 having a uniform size are arranged in the circuit region A and the peripheral circuit region B. The photodiodes are arranged between a ground terminal GND and an operational voltage terminal Vdd that is located between the isolation layers 30. The sharing circuit 40 and the peripheral circuit 50 are formed on composite wells 20, 26, 28 of the CMOS device.

Here, light 60, which is incident to a pixel through a micro lens, is refracted from insulating interlayers having different refractivities or a layer having an uneven surface and generates optical crosstalk. Thus, the refractive light is accumulated in an adjacent photodiode, not in the pixel to which the light is incident. Further, when the image sensor includes a color filter array having a red color, a green color and a blue color, the optical crosstalk can be further generated due to red incident rays having a long wavelength, such that a tint failure can be generated from the image sensor.

Further, electrons, which are thermally created outside of a depletion region in the semiconductor substrate diffuse in various directions because an electric field does not exist there. The electrons can accumulate in a pixel and generate electrical crosstalk. The electrical crosstalk causes a low resolution and a distorted image of the image sensor. Particularly, when a P type semiconductor substrate is used, the electrons accumulate more in the pixel because there does not exist a passageway through which the thermal electrons are drained outside of the depletion region.

FIGS. 4 to 14 are cross-sectional views illustrating a method of manufacturing a CMOS image sensor in accordance with an exemplary embodiment.

Figure 4:
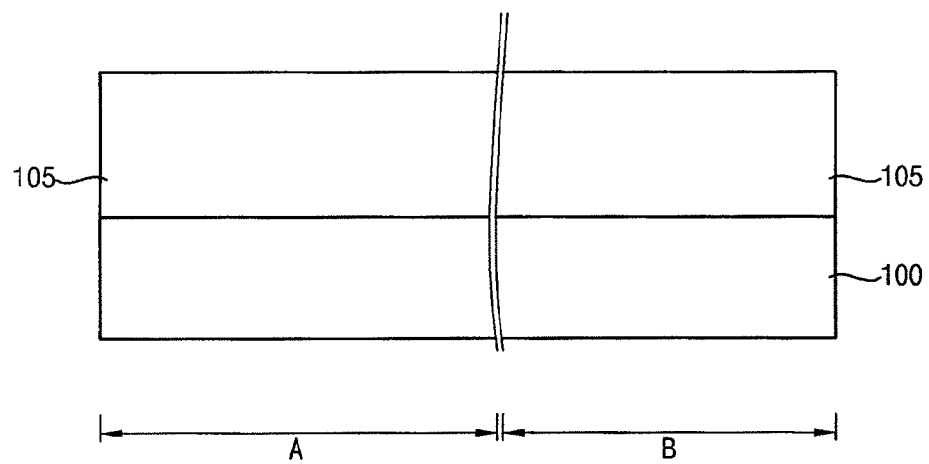
FIGS. 4 to 14 are cross-sectional views illustrating a method of manufacturing a CMOS image sensor in accordance with an exemplary embodiment.

Referring to FIG. 4, to minimize difficulties which may be caused by using the P type semiconductor substrate, the method includes using an N type semiconductor substrate 100. The N type semiconductor substrate 100 has a circuit region A where an active pixel sensor array and sharing elements are formed, and a peripheral circuit region B where a peripheral circuit is located.

The types of the semiconductor substrate have a great influence on the characteristics of the image sensor. Further, the types of the semiconductor substrate have different characteristics. For example, the P type semiconductor substrate may have better sensitivity than the N type semiconductor substrate, while the N type semiconductor substrate has better dark current and crosstalk properties than the P type semiconductor substrate.

Light is irradiated into the substrate to generate electron hole pairs. The electrons and holes drift in the depletion region due to an electric field. However, the electrons and the holes diffuse in various directions outside of the depletion region because an electric field does not exist outside of the depletion region. The irregularly diffused electrons and holes can accumulate in an adjacent pixel, not in the pixel from which the electrons and the holes are generated, to cause crosstalk.

Further, thermal electrons generated without light, and electrons and holes generated from cosmic rays, α particles or radiation rays, generate particles in the substrate that cause the dark currents and noise.

Therefore, an electrical passageway is needed through which the electrons, the holes and the particles can be selectively drained. Generally, the electrons are drained through the operational voltage terminal Vdd, and the holes are drained through the ground terminal GND. When a P type semiconductor substrate is used, a substrate voltage is simultaneously controlled using the operational voltage terminal Vdd. Thus, a substrate voltage terminal is needed on the backside of the P type semiconductor substrate or a structure configured to control the substrate voltage when the P type semiconductor substrate is included in a semiconductor package.

To address the above-mentioned difficulties, exemplary embodiments of the present invention use an N type semiconductor substrate.

A P type epitaxial layer 105 is formed on the N type semiconductor substrate 100. In an exemplary embodiment, the P type epitaxial layer 105 has a thickness of about 5 μm to about 15 μm to provide the P type epitaxial layer 105 with a sufficient space where semiconductor structures such as deep wells are formed.

Figure 5:
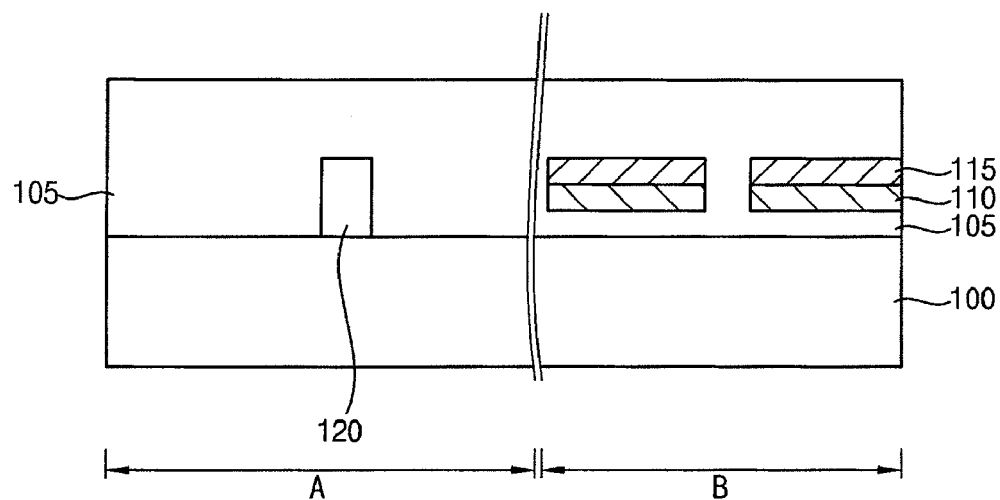

Referring to FIG. 5, a deep P well 110 and a deep N well 115 are sequentially formed in the P type epitaxial layer 105 in the peripheral circuit region B. A deep N well 120 is formed in the circuit region A. The deep N well 120 functions as a guardring of the circuit region A.

In an exemplary embodiment, the deep N well 115 in the peripheral circuit region B is formed by implanting phosphorus having a dose of about $4 \times 10^{13}$ using implantation energy of about 1.4 MeV. The deep P well 110 in the peripheral circuit region B is formed by implanting boron or boron fluoride having a dose of about $2 \times 10^{13}$ using implantation energy of about 1.4 MeV.

The deep N well 115 in the peripheral circuit region B is formed by implanting phosphorus having a dose of about $2 \times 10^{13}$ using implantation energy of about 2 MeV.

The deep N well 115 formed by implanting N type impurities is used as a triple well that provide peripheral circuits with various operational voltages. Here, when the N type semiconductor substrate 100 is used, the distance between the deep N well 115 and the N type semiconductor substrate 100 is very short. This can cause a punchthrough. To prevent punchthrough, the deep P well 110 under the deep N well 115 functions to isolate the deep N well 115 from the N type semiconductor substrate 100.

Further, the deep N well 120 in the circuit region A makes contact with a well under the operational voltage terminal Vdd. The deep N well 120 functions as an electrical passageway through which the thermal electrons generated from the N type semiconductor substrate 100 can be rapidly drained.

Figure 6:
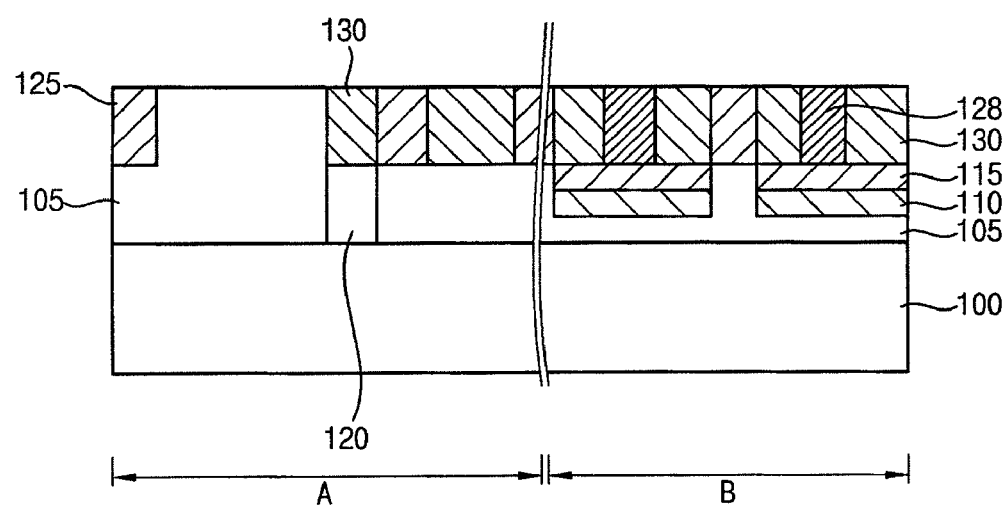

Referring to FIG. 6, shallow P wells 125, 128 are formed in a region of the circuit region A where the sharing circuits are formed except for a region where the photodiode is formed. A shallow N well 130 is formed in a region of the peripheral circuit region B where the peripheral circuits are formed. The shallow P wells 125, 128 and the shallow N well 130 have characteristics in accordance with operations of a CMOS device.

In an exemplary embodiment, to connect the ground terminal GND with the P well 125, the P well 125 is positioned at the left of the region of the circuit region A where the photodiode is formed. Further, to form the operational voltage terminal Vdd, the shallow N well 130 is located on the deep N well 120.

Various shallow wells can be formed in other regions to readily constitute a CMOS circuit. The shallow wells are formed by implanting impurities using masks as an ion implantation mask. Ion implantation energy is substantially similar to that used for forming the deep wells. The shallow N well 130 on the deep N well 120, which functions as the guardring of the circuit region A, has a high conductivity.

Figure 7:
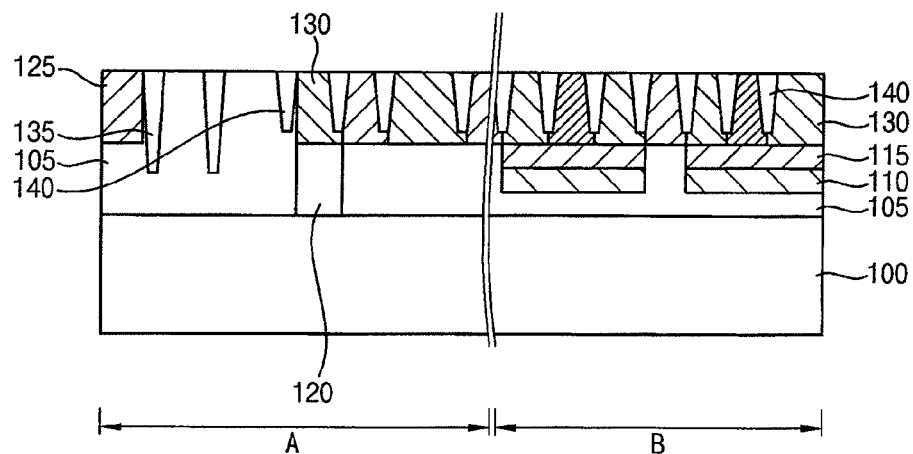

Referring to FIG. 7, isolation layers 135, 140 are formed in regions where the wells and the photodiodes 150 (see FIG. 8) are formed. In an exemplary embodiment, the isolation layer 135 between the photodiodes 150 has a thickness different from that of the isolation layer 140 between other elements.

The isolation layers 135, 140 mainly function to isolate the elements from each other. Here, the elements operate by electrons or holes at surfaces of the semiconductor substrate 100. The photodiodes 150 operate by absorbing blue light, green light and red light in the P type epitaxial layer 105 to increase accumulation sensitivity of the photodiodes 150. Here, because red light has a long wavelength of about 0.4 μm to about 5 μm, the photodiodes 150 have a thickness of no less than about 2 μm.

The elements operate and are isolated from each other under a condition that the isolation layer 140 has a thickness of no more than about 2 μm. However, when the isolation layer 135 between the photodiodes 150 has a thickness of no more than about 2 μm, crosstalk between the adjacent pixels is generated. Thus, the isolation layers 135, 140 with a thickness of above about 2 μm are needed. However, this may cause a wide width of the isolation layers 135, 140, so that the device may not be highly integrated any more. Therefore, only the isolation layer 135 between the photodiodes 150 has a thickness greater than that of the isolation layer 140 between the elements.

Further, to increase the sensitivity of the photodiodes 150 by capturing red light absorbed in the semiconductor substrate 100, photodiodes 150 with a thickness of above about 5 μm are needed. When the photodiodes 150 have a thickness of above about 5 μm, the depletion region is formed in an upper portion of the photodiodes 150, not a lower portion of the photodiodes 150 that has a thickness of about 5 μm measured from a lower surface of the photodiodes 150. As mentioned above, the particles, which cause the optical crosstalk, are generated in the depletion region. In contrast, the thermally generated electrons and holes are generated outside of the depletion region to cause electrical crosstalk. To prevent the generation of the crosstalk, the depletion region and the outside of the depletion region are provided with a relatively large size and a relatively small size, respectively. This is accomplished by providing the P type epitaxial layer 105 with a low concentration and a small size. Further, the deep isolation layer 135 is formed under the depletion region to prevent the generation of crosstalk.

However, processes for forming the isolation layers having thick thicknesses can be difficult. Thus, according to an exemplary embodiment, the isolation layer 135 between the photodiodes 150 has a thickness different than that of the isolation layer 140 between the elements.

Figure 8:
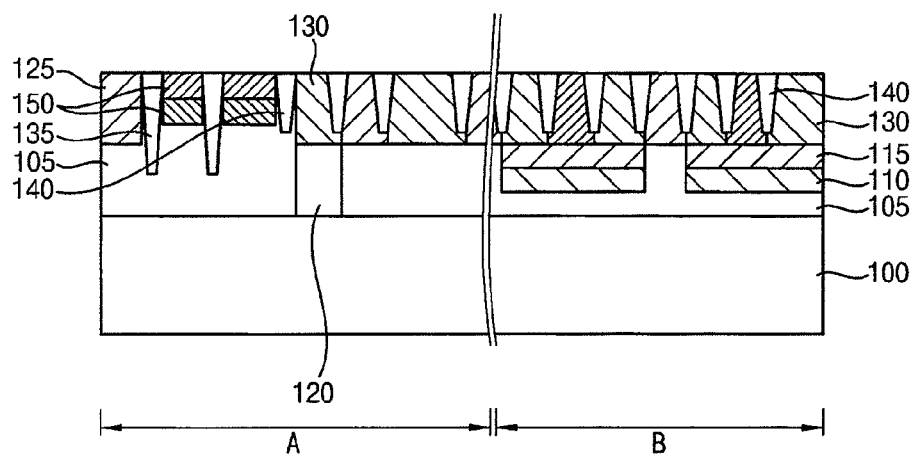

Referring to FIG. 8, the photodiode 150 is formed in the circuit region A. In an exemplary embodiment, because the photodiode 150 has a vertical structure located on the P type epitaxial layer 105, an N type impurity region and a P type impurity region are sequentially formed to form the photodiode 150. Here, to operate the device, the depletion region is formed between the photodiode 150 and the P type epitaxial layer 105.

Further, as mentioned above, because the photodiode 150 has improved sensitivity by capturing all of the red light under a condition that the thickness of the photodiode 150 is greater than a maximum wavelength of red light, the N type impurity region is formed in a portion of the photodiode 150 that has a thickness of about 5 μm measured from the lower surface of the photodiode 150 by controlling energy.

Furthermore, the depletion region is formed between the photodiode 150 and the P type epitaxial layer 105. The rate of generation of electrical crosstalk can be reduced by enlarging the area of the depletion region. Therefore, proper control of the concentration of the P type epitaxial layer 105 is needed.

The device of the exemplary embodiment having the elements in the circuit region A has following features. To provide the image sensor with improved sensitivity without the crosstalk, light irradiated to the photodiode 150 is accumulated in a corresponding pixel, not an adjacent pixel. That is, optical crosstalk can be generated by the accumulation of light in the adjacent pixel, which is selected by a color filter over the photodiode 150, that is refracted in accordance with refractivity and the shape of the semiconductor substrate 100 or an insulating interlayer. To structurally prevent the generation of the optical crosstalk, the deep isolation layer 135 is formed between the photodiodes 150 to prevent the light from being refracted toward the adjacent pixel.

When the deep isolation layer 135 has a thickness sufficiently greater than that of the photodiode 150, the accumulation of the light in the adjacent pixel is reduced or not generated. Thus, the deep isolation layer 135 functions to primarily prevent the generation of the optical crosstalk. Here, in an exemplary embodiment, the deep isolation layer 135 is located outside of the P well 125. Alternatively, the deep isolation layer 135 can be positioned in the P well 125 to form a potential barrier that functions to prevent electrons being generated by dangling bonds at an interface of a trench for forming the isolation layers.

The thermal electron hole pairs, which are generated in the outside of the depletion region, diffuse in various directions due to non-existence of an electric field. The thermal electron hole pairs can accumulate in other pixels to generate the electrical crosstalk. The deep isolation layer 135 partially prevents the thermal electron hole pairs from being accumulated in other pixels. However, the deep isolation layer 135 completely blocks all of the thermal electron hole pairs. The electrical crosstalk is reduced by enlarging the area of the depletion region and also reducing the area of the outside of the depletion region. The area of the depletion region under the photodiode 150 is enlarged by increasing the concentration of the P type epitaxial layer 105 and also reducing an area of the P type epitaxial layer 105.

The electrons and the holes generated outside of the depletion region are removed by electrically coupling the electrons and the holes with each other. This is accomplished by draining the electrons and the holes through the ground terminal GND and the operational voltage terminal Vdd.

In an exemplary embodiment, because the semiconductor substrate 100 is the N type, the deep N well 120 is connected to the operational voltage terminal Vdd. Thus, the electrons are drained through the operational voltage terminal Vdd via the deep N well 120 as an electrical drain passageway. The holes are drained through the ground terminal GND via the P well 125.

Therefore, the optical crosstalk and the electrical crosstalk is not generated in the photodiode 150 in the circuit region A due to the deep isolation layer 135 and the deep N well 120. As a result, the image sensor has improved sensitivity without noise.

Figure 9:
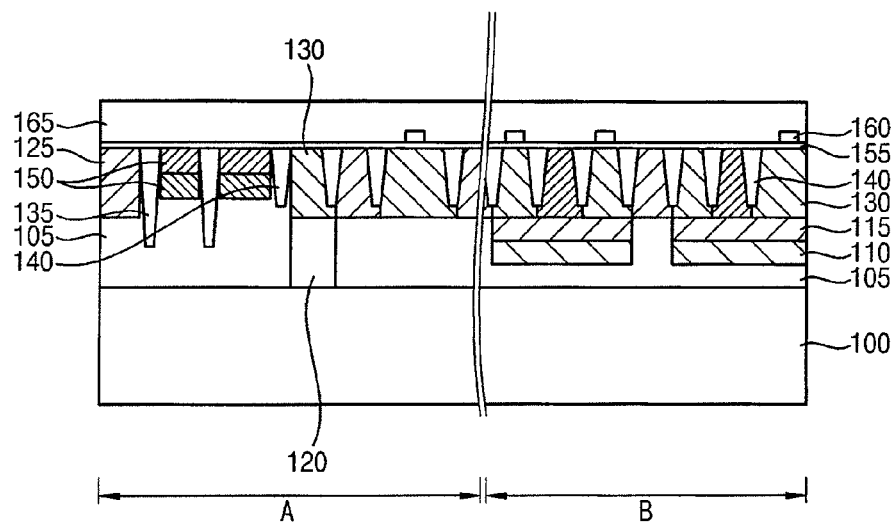

Referring to FIG. 9, a gate insulating layer 155 is formed on the circuit region A and the peripheral circuit region B. Gate electrodes 160 are formed on the gate insulating layer 155. Impurity regions (not shown) are formed at both sides of the gate electrodes 160. A first insulating interlayer 165 is formed on the gate insulating layer 155 to cover the gate electrodes 160.

Figure 10:
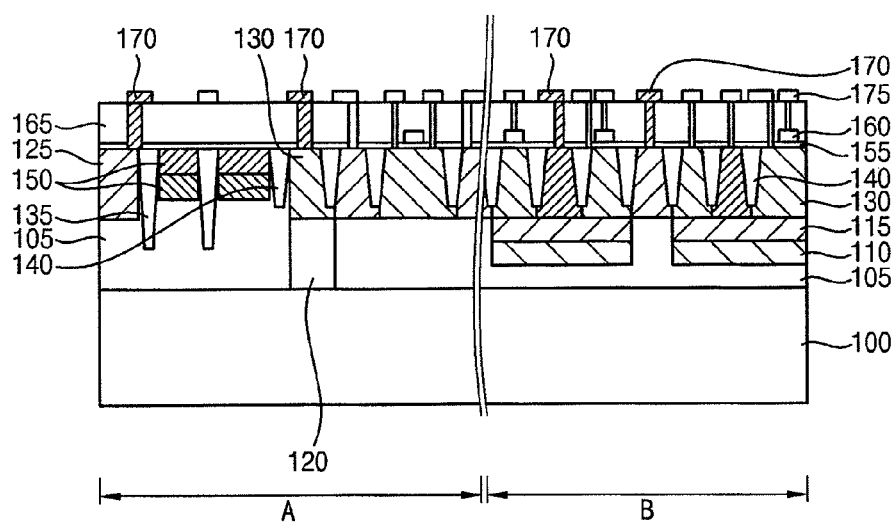

Referring to FIG. 10, first metal wirings 170, 175 are formed on the first insulating interlayer 165. In an exemplary embodiment, the first metal wirings 170, 175 are connected to a gate terminal or source/drain terminals to serve as the ground terminal GND or the operational voltage terminal Vdd.

Figure 11:
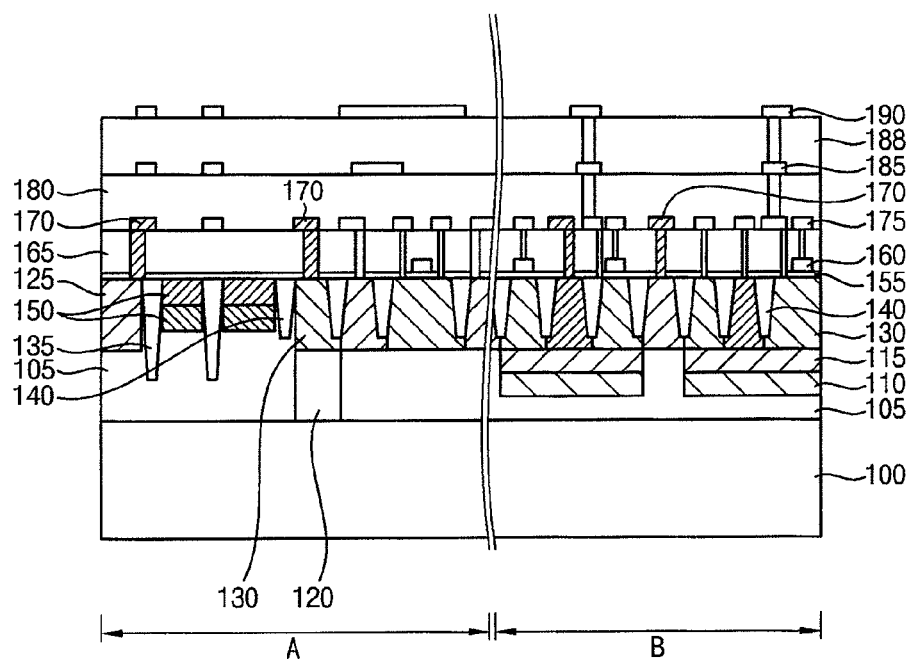

Referring to FIG. 11, after forming the first metal wirings 170, 175 on the first insulating interlayer 165, a second insulating interlayer 180 is formed on the first insulating interlayer 165 to cover the first metal wirings 170, 175. A second metal wiring 185 is formed through the second insulating interlayer 180. The second metal wiring 185 is electrically connected to the first metal wiring 170. A third insulating interlayer 188 is formed on the second insulating interlayer 180 to cover the second metal wiring 185. A third metal wiring 190 is formed through the third insulating interlayer 188. The third metal wiring 190 is electrically connected to the second metal wiring 185.

Figure 12:
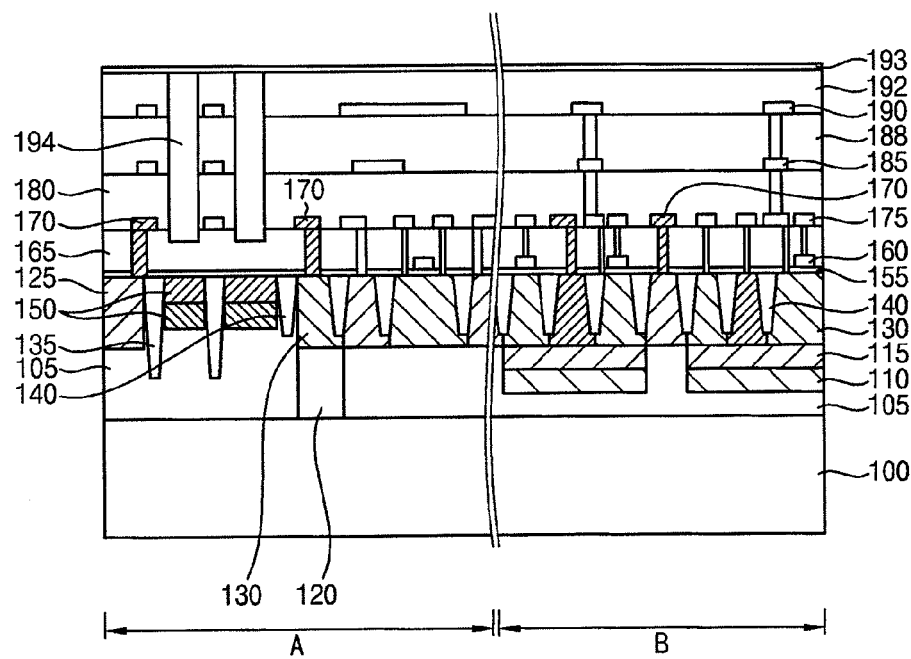

Referring to FIG. 12, a fourth insulating interlayer 192 is formed on the third insulating interlayer 188 to cover the third metal wiring 190. A protecting layer 193 is formed on the fourth insulating interlayer 192. The protecting layer 193, the fourth insulating interlayer 192, the third insulating interlayer 188, the second insulating interlayer 180 and the first insulating interlayer 165 on the photodiode 150 are partially etched to form openings as light transmission passageway. The openings are filled with an oxide layer or a transparent resin layer 194. Here, the first to fourth insulating interlayers 165, 180, 188, 192 have refractivity different from that of the protecting layer 193 due to different materials or uneven surfaces. The transparent resin layer 194 in the openings allow light to readily pass through the openings under the above-mentioned conditions.

After forming the transparent resin layer 194 in the openings, the transparent resin layer 194 is then planarized to form a color filter layer later.

Figure 13:
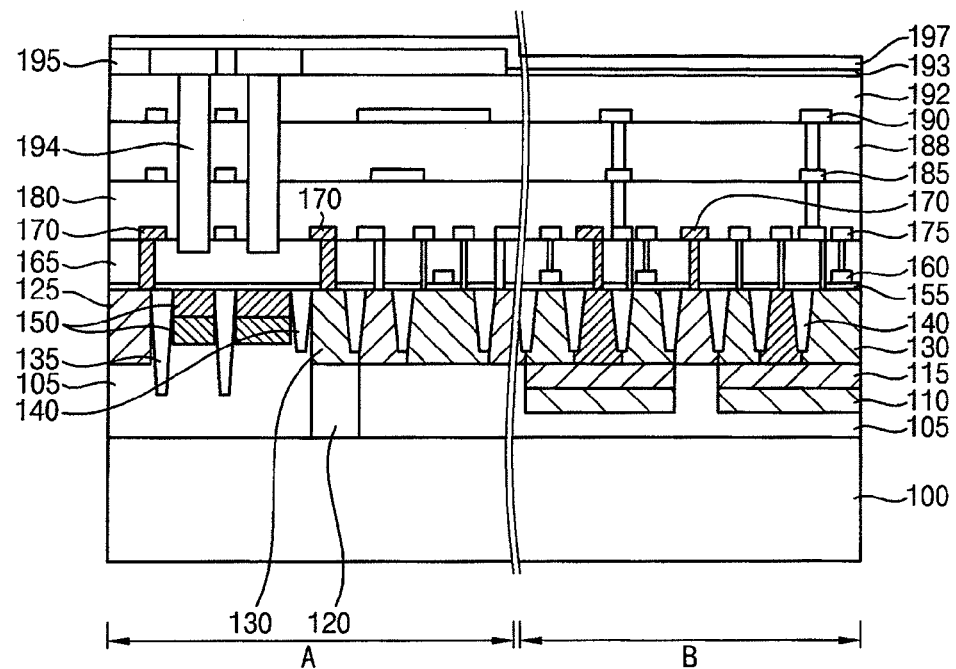

Referring to FIG. 13, the color filter layer 195 is formed on the transparent resin layer 194. In an exemplary embodiment, there two transparent resin layers 194. Additionally, when the image sensor use a color filter array having a red color, a green color and a blue color, at least three transparent resin layers 194 and at least three photodiodes 150 are needed.

Here, the color filter layer 195 is needed only in the circuit region A. Thus, a portion of the color filter layer 195 in the peripheral circuit region B is then removed to form a planarization layer 197.

Figure 14:
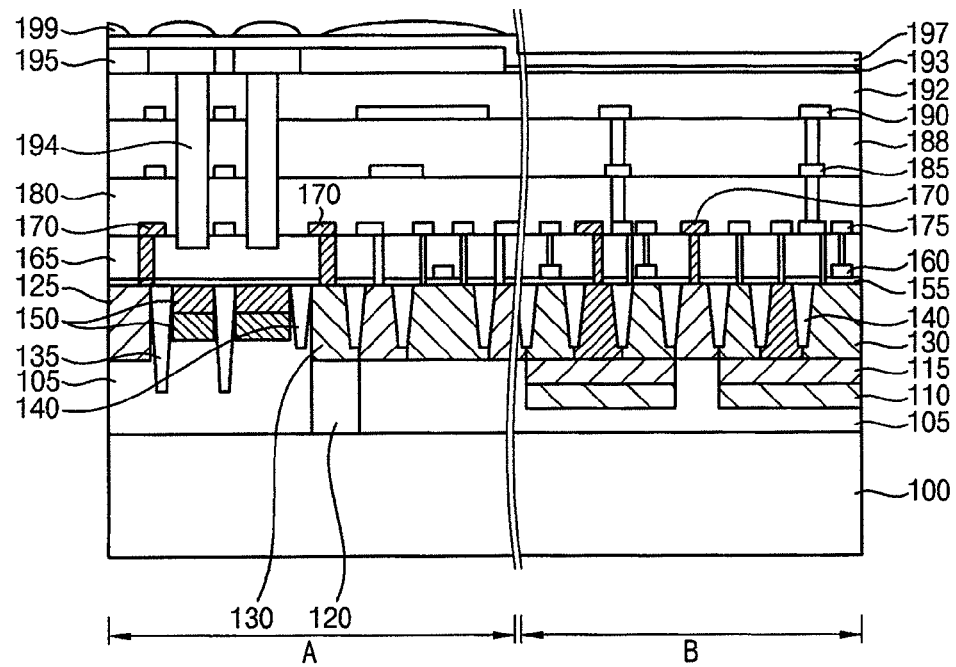

Referring to FIG. 14, a micro lens 199 is formed on the color filter layer 195 and the planarization layer 197.

The color filter layer 195 selectively selects desired colors in the light passing through the micro lens 199. The selected light colors accumulate in the photodiode 150 through the transparent resin layer 194.

As mentioned above, selected light colors can overflow the photodiode 150 and then accumulate in the adjacent pixel under a condition that the first to fourth insulating interlayers 165, 180, 188, 192 make contact with the first to third metal wirings 170, 185, 190 to generate the crosstalk. The crosstalk causes low sensitivity of the image sensor.

However, according to the exemplary embodiment, the deep isolating layer 135 has a thickness greater than that of the photodiode 150 to isolate the photodiodes 150 from each other to prevent the generation of the optical crosstalk. Further, the thermal electrons generated outside of the depletion region are drained through the operational voltage terminal Vdd via the deep N well 120 and the N well 130 to prevent the generation of electrical crosstalk. As a result, the CMOS image sensor has improved sensitivity without both the optical and electrical crosstalk.

FIGS. 15 to 25 are cross-sectional views illustrating a method of manufacturing a CMOS image sensor in accordance with an exemplary embodiment.

Figure 15:
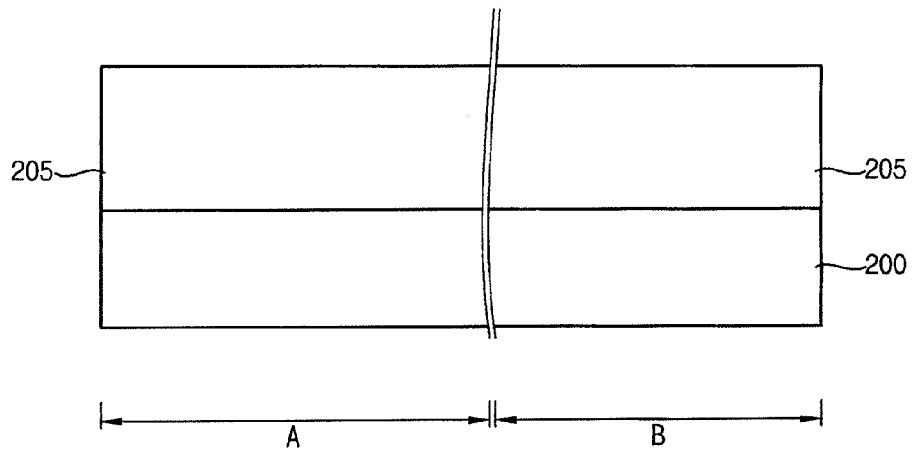
FIGS. 15 to 25 are cross-sectional views illustrating a method of manufacturing a CMOS image sensor in accordance with an exemplary embodiment.

Referring to FIG. 15, the method of the exemplary embodiment includes using an N type semiconductor substrate 200. The N type semiconductor substrate 200 has a circuit region A where an active pixel sensor array and sharing elements are formed, and a peripheral circuit region B where a peripheral circuit is located. As discussed above, types of the semiconductor substrate have great influence on the characteristics of the image sensor.

Light is irradiated into the substrate to generate electron hole pairs. The electrons and holes drift in the depletion region due to an electric field. However, the electrons and the holes diffuse in various directions outside of the depletion region because an electric field does not exist outside of the depletion region. The irregularly diffused electrons and holes can accumulate in an adjacent pixel, not in the pixel from which the electrons and the holes are generated, to cause crosstalk.

Further, thermal electrons generated without light, and electrons and holes generated from cosmic rays, α particles and a radiation rays, generate particles in the substrate that cause dark currents and noise.

Therefore, an electrical passageway is needed through which the electrons, the holes and the particles can be selectively drained. Generally, the electrons are drained through the operational voltage terminal Vdd, and the holes are drained through the ground terminal GND. When a P type semiconductor substrate is used, the substrate voltage is simultaneously controlled using the operational voltage terminal Vdd. Thus, a substrate voltage terminal is needed on the backside of the P type semiconductor substrate or a structure configured to control the substrate voltage when the P type semiconductor substrate is included in a semiconductor package.

To address the above-mentioned difficulties, exemplary embodiments of the present invention use the N type semiconductor substrate.

A P type epitaxial layer 205 is formed on the N type semiconductor substrate 200. In an exemplary embodiment, the P type epitaxial layer 205 has a thickness of about 5 μm to about 15 μm to provide the P type epitaxial layer 205 with a sufficient space where semiconductor structures such as deep wells are formed. Here, an impurity concentration of the P type epitaxial layer 205 serves as an important factor for forming the depletion region at an interface between the P type epitaxial layer 205 and a photodiode. When the impurity concentration of the P type epitaxial layer 205 is high, the depletion region has a small size, so that the outside of the depletion region where the thermal electrons are generated is too large. Thus, in an exemplary embodiment the P type epitaxial layer 205 is provided with a low impurity concentration. However, when the impurity concentration of the P type epitaxial layer 205 is too low, the thermal electrons are not readily drained.

Figure 16:
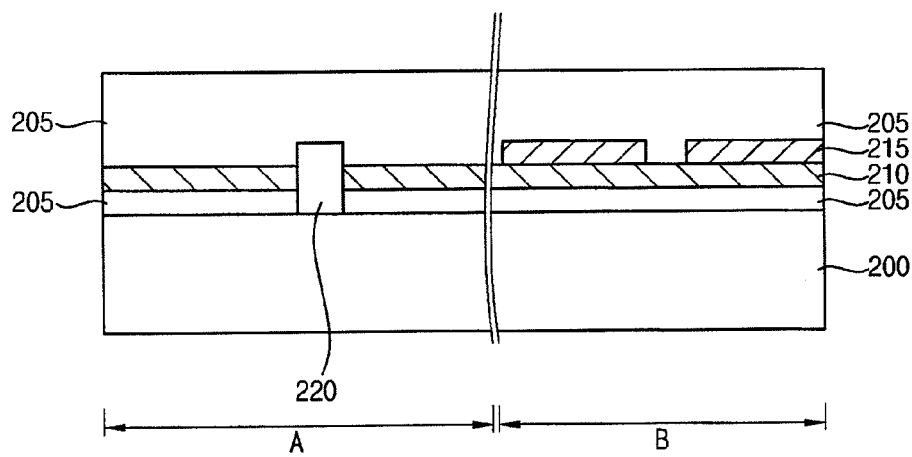

Referring to FIG. 16, a P$^+$ well 210 is formed on the P type epitaxial layer 205 under the depletion region, because the low impurity concentration does not allow the electrons and the holes to readily move. The P$^+$ well 210 in the circuit region A functions to reduce the resistance of the N type semiconductor substrate 200 and also the area outside of the depletion region.

Further, a P$^+$ well 210 in the peripheral circuit region B serves as an isolation layer for preventing a punchthrough with respect to the N type semiconductor substrate 200 due to a deep N well 215. In an exemplary embodiment, the P$^+$ well 210 is formed by an ion implantation process without a mask. The P$^+$ well 210 is spaced apart from the N type semiconductor substrate 200 to reduce the area of the outside of the depletion region where the thermal electrons are generated, and also remove the thermal electrons and the holes by recouping with each other.

The deep N well 220 is formed in the circuit region A. The deep N well 220 functions as a guardring of the circuit region A. The deep N well 220 controls a voltage of the N type semiconductor substrate 200 to function as an electrical passageway through which the thermal electrons generated outside of the depletion region can be rapidly drained. The deep N well 220 in the circuit region A is formed through the P$^+$ well 210 to allow the deep N well 220 to make contact with the N type semiconductor substrate 200.

In an exemplary embodiment, the deep N well 215 in the peripheral circuit region B is formed by implanting phosphorus having a dose of about $4 \times 10^{13}$ using implantation energy of about 1.4 MeV.

The deep N well 220 in the peripheral circuit region A is formed by implanting impurities having a dose of about $2 \times 10^{13}$ using implantation energy of about 2 MeV.

Here, because the P$^+$ well 210 is formed by the ion implantation process, the P$^+$ well 210 does not make contact with the N type semiconductor substrate 200. That is, the P type epitaxial layer 205 is interposed between the P$^+$ well 210 and the N type semiconductor substrate 200.

The deep N well 215 formed by implanting N type impurities is used as a triple well that provides peripheral circuits with various operational voltages. Here, when the N type semiconductor substrate 200 is used, the distance between the deep N well 215 and the N type semiconductor substrate 200 is very short. This can cause a punchthrough. To prevent the punchthrough, the deep P$^+$ well 210 under the deep N well 215 functions to isolate the deep N well 215 from the N type semiconductor substrate 200.

Further, the deep N well 220 in the circuit region A functions as an electrical passageway through which the thermal electrons generated from the N type semiconductor substrate 200 can be rapidly drained. In an exemplary embodiment, because the deep N well 220 is formed through the P$^+$ well 210 under the depletion region, the thermal electrons are more rapidly drained through the operational voltage terminal Vdd.

Figure 17:
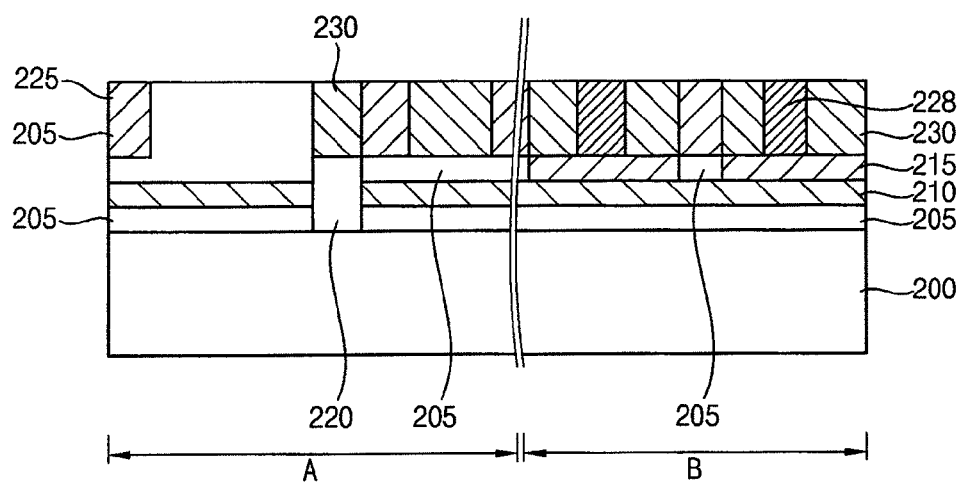

Referring to FIG. 17, shallow P wells 225, 228 are formed in a region of the circuit region A where the sharing circuits are formed except for a region where the photodiode is formed. A shallow N well 230 is formed in a region of the peripheral circuit region B where the peripheral circuits are formed. The shallow P wells 225, 228 and the shallow N well 230 have characteristics in accordance with operations of a CMOS device.

In an exemplary embodiment, to connect the ground terminal GND with the P well 225, the P well 225 is positioned left of the region of the circuit region A where the photodiode is formed. Further, to form the operational voltage terminal Vdd, the shallow N well 230 is located on the deep N well 220.

Various shallow wells can be formed in other regions to readily constitute a CMOS circuit. The shallow wells are formed by implanting impurities using masks as an ion implantation mask. Ion implantation energy is substantially similar to that used for forming the deep wells. The shallow N well 230 on the deep N well 220, which functions as the guardring of the circuit region A, has a high conductivity.

Figure 18:
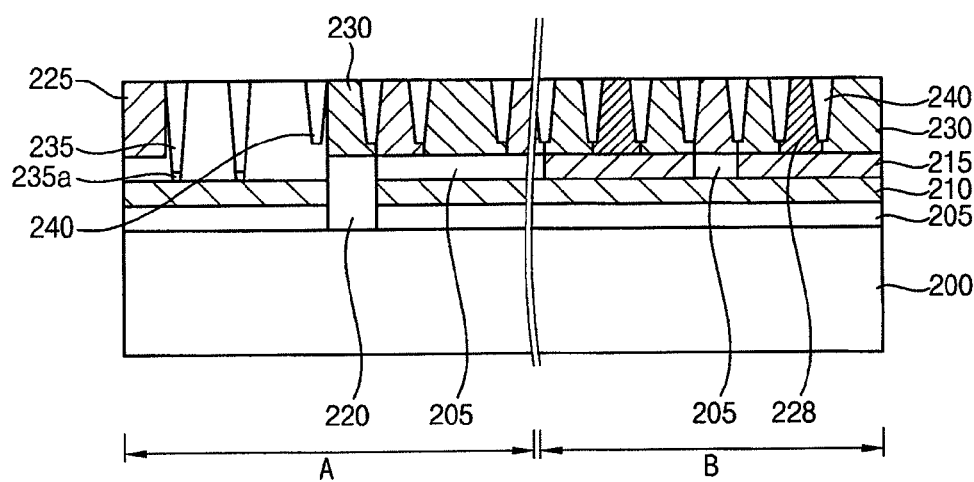

Referring to FIG. 18, isolation layers 235, 240 are formed in regions where the wells and the photodiodes are formed. In an exemplary embodiment, the isolation layer 235 between the photodiodes has a thickness different from that of the isolation layer 240 between other elements.

The isolation layers 235, 240 mainly function to isolate the elements from each other. Here, the elements operate by electrons or holes at surfaces of the semiconductor substrate 200. The photodiodes operate by absorbing blue light, green light and red light in the P type epitaxial layer 205 to increase accumulation sensitivity of the photodiodes. Because red light has a long wavelength of about 0.4 μm to about 5 μm, the photodiodes have a thickness of no less than about 2 μm.

The elements operate and are isolated from each other under a condition that the isolation layer 240 has a thickness of no more than about 2 μm. However, when the isolation layer 235 between the photodiodes has a thickness of no more than about 2 μm, crosstalk between the adjacent pixels is generated. Thus, the isolation layers 235, 240 with a thickness of above about 2 μm are needed. However, this causes a wide width of the isolation layers 235, 240, so that the device is not highly integrated any more. Therefore, only the isolation layer 235 between the photodiodes has the thickness greater than that of the isolation layer 240 between the elements.

Further, to increase the sensitivity of the photodiodes by capturing red light absorbed in the semiconductor substrate 200, the photodiodes 250 with a thickness of above about 5 μm are needed. When the photodiodes 250 have a thickness of above about 5 μm, the depletion region is formed in an upper portion of the photodiodes, not a lower portion of the photodiodes that have a thickness of about 5 μm measured from a lower surface of the photodiodes. As mentioned above, the particles, which cause the optical crosstalk, are generated in the depletion region. In contrast, the thermally generated electrons and holes are generated outside of the depletion region to cause the electrical crosstalk. To prevent the generation of crosstalk, the depletion region and the outside of the depletion region are provided with a relatively large size and a relatively small size, respectively. These are accomplished by providing the P type epitaxial layer 205 with a low concentration and a small size. Further, the deep isolation layer 235 is formed under the depletion region to prevent the generation of crosstalk.

However, processes for forming the isolation layers having thick thicknesses can be difficult. Thus, according to an exemplary embodiment, the isolation layer 235 between the photodiodes 250 has a thickness different than that of the isolation layer 240 between the elements.

According to an exemplary embodiment, after forming a deep trench, an impurity junction 235a is formed by an ion implantation process. The impurity junction 235a makes contact with the P$^+$ well 210. However, when it is unnecessary to form the deep P$^+$ well 210, the impurity region 235a corresponds to an isolation region formed by a trench formation process. The isolation region makes contact with the P$^+$ well 210. Here, in an exemplary embodiment, the deep isolation layer 235 is located outside of the P well 225. Alternatively, the deep isolation layer 235 can be positioned in the P well 225 to form a potential barrier that functions to prevent electrons being generated by dangling bonds at an interface of a trench for forming the isolation layers.

Figure 19:
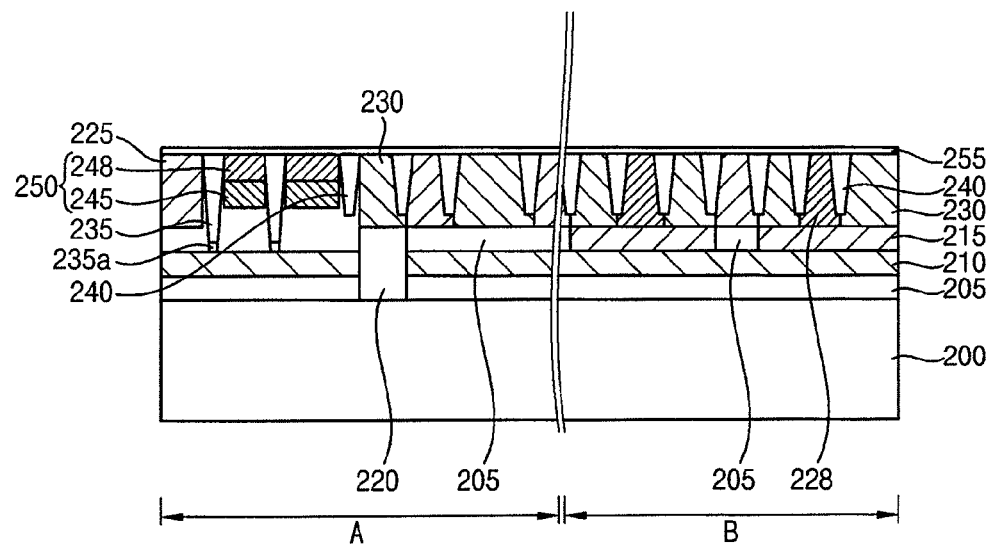

Referring to FIG. 19, the photodiode 250 is formed in the circuit region A. In an exemplary embodiment, because the photodiode 250 has a vertical structure located on the P type epitaxial layer 205, an N type impurity region and a P type impurity region are sequentially formed to form the photodiode 250. Here, to operate the device, the depletion region is formed between the photodiode 250 and the P type epitaxial layer 205.

Further, as mentioned above, because the photodiode 250 has improved sensitivity by capturing all of the red light under a condition that the thickness of the photodiode 250 is greater than a maximum wavelength of red light, the N type impurity region is formed in a portion of the photodiode 250 that has a thickness of about 5 μm measured from the lower surface of the photodiode 250 by controlling energy.

Furthermore, the depletion region is formed between the photodiode 250 and the P type epitaxial layer 205. The rate of generation of electrical crosstalk can be reduced by enlarging the area of the depletion region. Therefore, the P type epitaxial layer 205 with a low impurity concentration is needed. In an exemplary embodiment, the P type epitaxial layer 205 is provided with the low impurity concentration. Further, the P$^+$ well 210 is spaced apart from the N type semiconductor substrate 200 to reduce the area outside of the depletion region.

The device of the exemplary embodiment having the elements in the circuit region A has the following features. To provide the image sensor with improved sensitivity without crosstalk, light irradiated to the photodiode 250 is accumulated in a corresponding pixel, not an adjacent pixel. That is, the optical crosstalk can be generated by the accumulation of light in the adjacent pixel, which is selected by a color filter over the photodiode 250, that is refracted in accordance with refractivity and a shape of the semiconductor substrate 200 or an insulating interlayer. To structurally prevent the generation of the optical crosstalk, the deep isolation layer 235 is formed between the photodiodes 250 to prevent the light from being refracted toward the adjacent pixel.

When the deep isolation layer 235 and the impurity junction 235a have a thickness sufficiently greater than that of the photodiode 250, the accumulation of light in the adjacent pixel is reduced or not generated. Thus, the deep isolation layer 235 and the impurity junction 235a function to primarily prevent the generation of the optical crosstalk.

The electrons and the holes generated in the outside of the depletion region are readily drained through the operational voltage terminal Vdd via the P+ well 210 and the deep N well 220.

The photodiode 250 has a crosstalk-preventive structure having an isolation structure that is formed by combining the deep isolation layer 235, the impurity junction 235a and the deep N well 220. Therefore, the optical crosstalk and the electrical crosstalk are not generated in the photodiode 250 in the circuit region A. As a result, the image sensor has improved sensitivity without noise.

Figure 20:
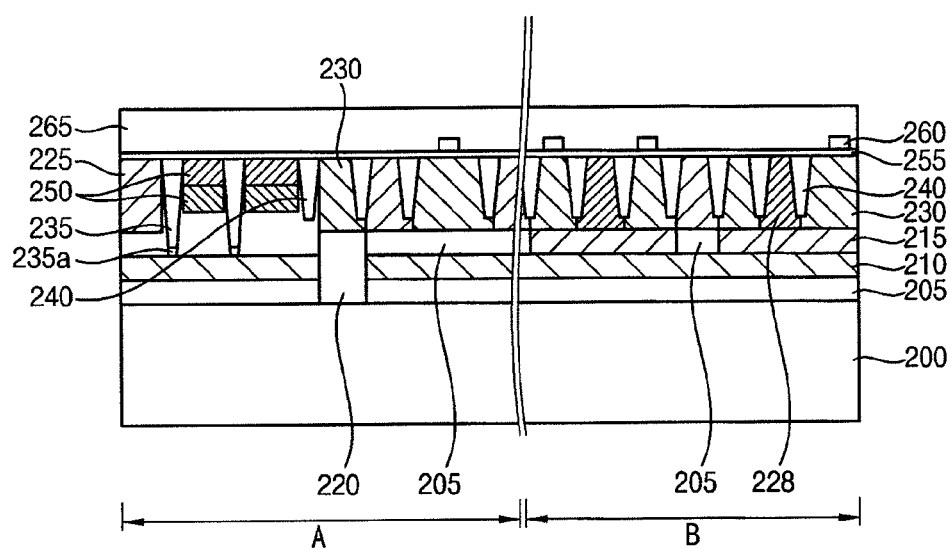

Referring to FIG. 20, a gate insulating layer 255 is formed on the circuit region A and the peripheral circuit region B. Gate electrodes 260 are formed on the gate insulating layer 255. Impurity regions (not shown) are formed at both sides of the gate electrodes 260. A first insulating interlayer 265 is formed on the gate insulating layer 255 to cover the gate electrodes 260.

Figure 21:
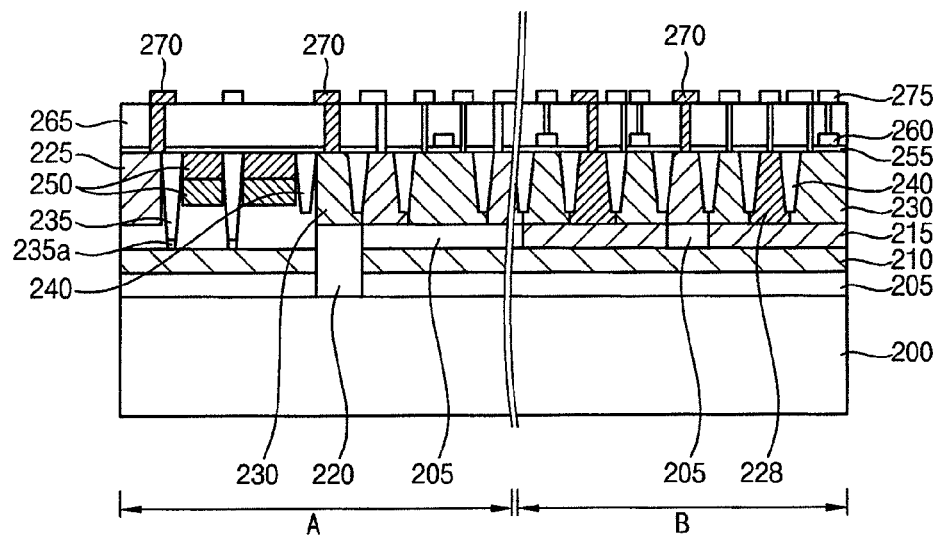

Referring to FIG. 21, first metal wirings 270, 275 are formed on the first insulating interlayer 265. In an exemplary embodiment, the first metal wirings 270, 275 are connected to a gate terminal or source/drain terminals to serve as the ground terminal GND or the operational voltage terminal Vdd.

Figure 22:
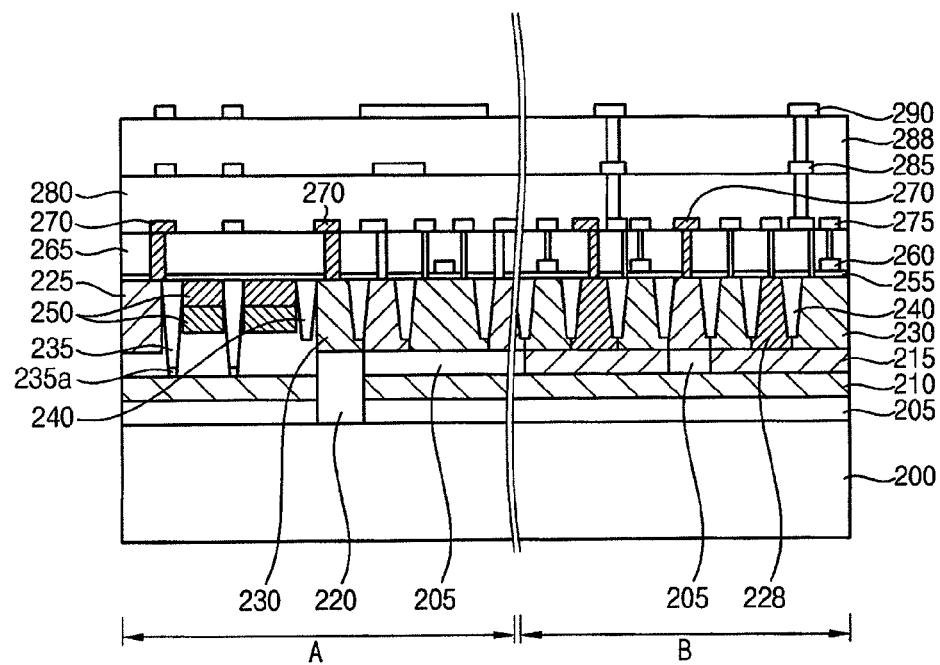

Referring to FIG. 22, after forming the first metal wirings 270, 275 on the first insulating interlayer 265, a second insulating interlayer 280 is formed on the first insulating interlayer 265 to cover the first metal wirings 270, 275. A second metal wiring 285 is formed through the second insulating interlayer 280. The second metal wiring 285 is electrically connected to the first metal wiring 270. A third insulating interlayer 288 is formed on the second insulating interlayer 280 to cover the second metal wiring 285. A third metal wiring 290 is formed through the third insulating interlayer 288. The third metal wiring 290 is electrically connected to the second metal wiring 285.

Figure 23:
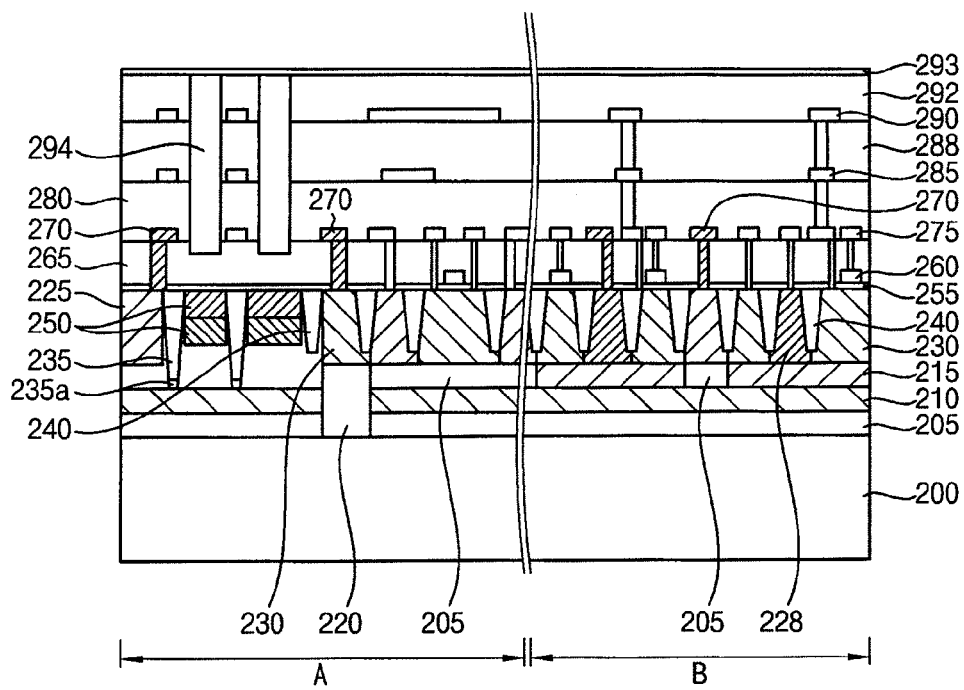

Referring to FIG. 23, a fourth insulating interlayer 292 is formed on the third insulating interlayer 288 to cover the third metal wiring 290. A protecting layer 293 is formed on the fourth insulating interlayer 292. The protecting layer 293, the fourth insulating interlayer 292, the third insulating interlayer 288, the second insulating interlayer 280 and the first insulating interlayer 265 on the photodiode 250 is partially etched to form openings as light transmission passageway. The openings are filled with an oxide layer or a transparent resin layer 294. Here, the first to fourth insulating interlayers 265, 280, 288, 292 have refractivity different from that of the protecting layer 293 due to different materials or uneven surfaces. The transparent resin layer 294 in the openings allow the light to readily pass through the openings under the above-mentioned conditions.

After forming the transparent resin layer 294 in the openings, the transparent resin layer 294 is then planarized to form a color filter layer later.

Figure 24:
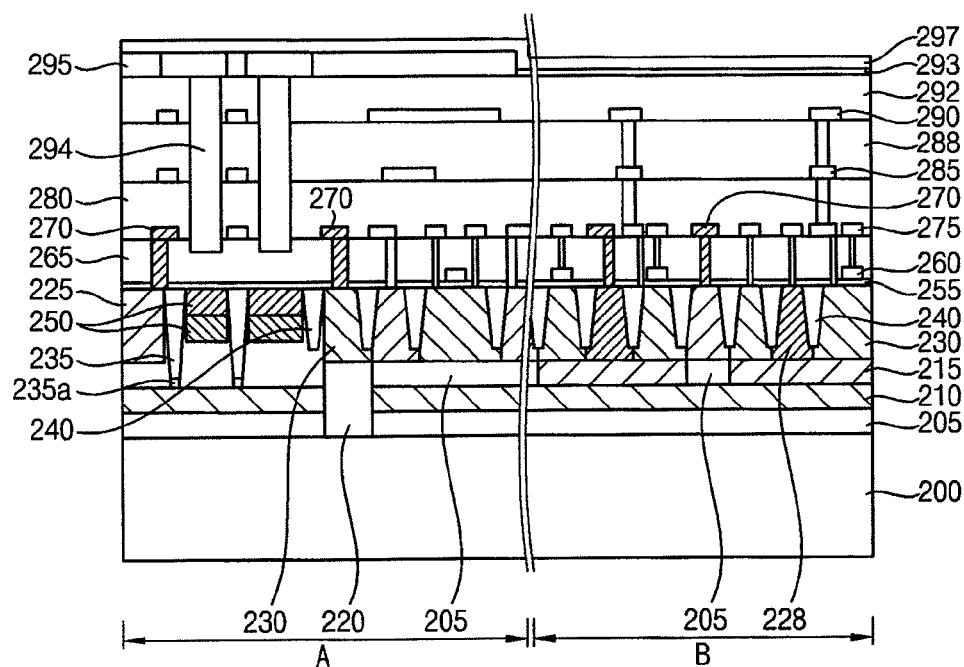

Referring to FIG. 24, the color filter layer 295 is formed on the transparent resin layer 294. Here, in an exemplary embodiment, two transparent resin layers 294 are depicted. Additionally, when the image sensor uses a color filter array having a red color, a green color and a blue color, at least three transparent resin layers 294 and at least three photodiodes 250 are needed.

Here, the color filter layer 295 is needed only in the circuit region A. Thus, a portion of the color filter layer 295 in the peripheral circuit region B is then removed to form a planarization layer 297.

Figure 25:
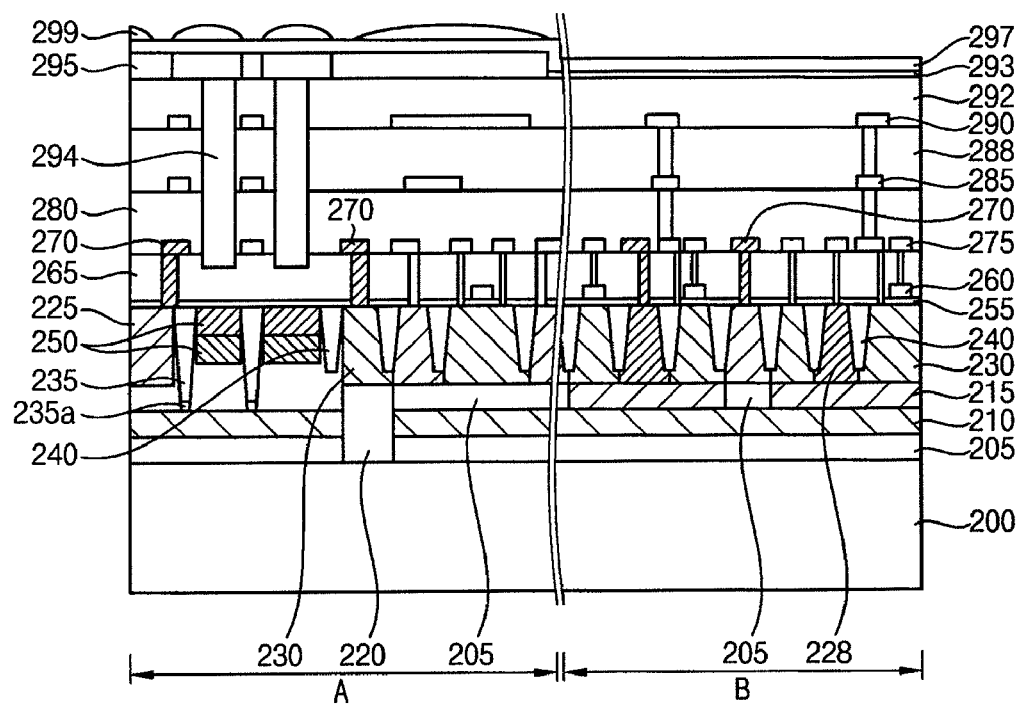

Referring to FIG. 25, a micro lens 299 is formed on the color filter layer 295 and the planarization layer 297.

The color filter layer 295 selectively selects desired colors in the light passing through the micro lens 299. The selected light is accumulated in the photodiode 250 through the transparent resin layer 294.

As mentioned above, selected light can overflow the photodiode 250. The overflowing light is then accumulated in the adjacent pixel under a condition that the first to fourth insulating interlayers 265, 280, 288, 292 make contact with the first to third metal wirings 270, 285, 290 to generate crosstalk. The crosstalk causes low sensitivity of the image sensor.

However, according to the exemplary embodiment, the deep isolating layer 235, the impurity junction 235a and the P+ well 210 sufficiently isolate the adjacent photodiode 250 to prevent the generation of optical crosstalk. Further, the thermal electrons generated outside of the depletion region are drained through the operational voltage terminal Vdd via the deep N well 220 and the P+ well 210 to prevent the generation of electrical crosstalk. As a result, the CMOS image sensor has improved sensitivity without crosstalk.

FIGS. 26 to 36 are cross-sectional views illustrating a method of manufacturing a CMOS image sensor in accordance with an exemplary embodiment.

Figure 26:
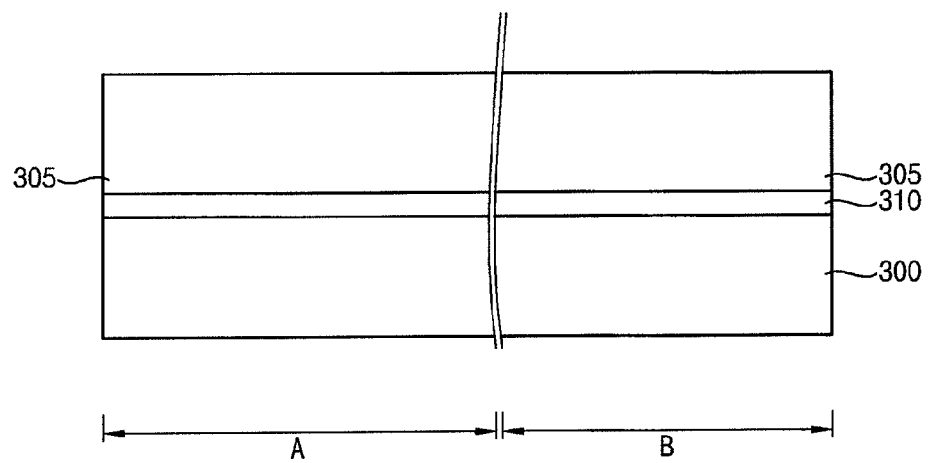
FIGS. 26 to 36 are cross-sectional views illustrating a method of manufacturing a CMOS image sensor in accordance with an exemplary embodiment.

Referring to FIG. 26, the method of the exemplary embodiment includes using an N type semiconductor substrate 300. The N type semiconductor substrate 300 has a circuit region A where an active pixel sensor array and sharing elements are formed, and a peripheral circuit region B where a peripheral circuit is located. As mentioned above, the types of the semiconductor substrate have a great influence on the characteristics of the image sensor.

Light is irradiated into the substrate to generate electron hole pairs. The electrons and holes drift in the depletion region due to an electric field. However, the electrons and the holes diffuse in various directions outside of the depletion region because an electric field does not exist outside of the depletion region. The irregularly diffused electrons and holes can accumulate in an adjacent pixel, not in the pixel from which the electrons and the holes are generated, to cause crosstalk.

A P+ well 310 and a P− well 305 are sequentially be formed on the N type semiconductor substrate 300. The P+ well 310 is formed by heavily doping impurities and the P− well 305 is then formed by lightly doping impurities. Here, the P+ well 310 functions like the P+ well 210 in the embodiment depicted in FIGS. 15-25. Because the P+ well 310 and the P− well 305 are formed by a single ion implantation process, the method of the exemplary embodiment is simple as compared to that in the previous embodiment. Further, because the P+ well 310 makes contact with the N type semiconductor substrate 300, the thermal electrons and the holes are readily drained through the operational voltage terminal Vdd and the ground terminal GND, respectively.

In an exemplary embodiment, the P− type epitaxial layer 305 has a thickness of about 5 μm to about 15 nm to provide the P− type epitaxial layer 305 with a sufficient space where semiconductor structures such as deep wells are formed. Here, an impurity concentration of the P− type epitaxial layer 305 serves as an important factor for forming the depletion region at an interface between the P− type epitaxial layer 305 and a photodiode. When the impurity concentration of the P− type epitaxial layer 305 is high, the depletion region has a small size, so that the outside of the depletion region where the thermal electrons are generated is too large. Thus, in an exemplary embodiment the P− type epitaxial layer 305 is provided with a low impurity concentration. However, when the impurity concentration of the P− type epitaxial layer 305 is too low, the thermal electrons are not readily drained. The P+ well 310 makes contact with the N type semiconductor substrate 300 to reduce a resistance of the N type semiconductor substrate 300.

Figure 27:
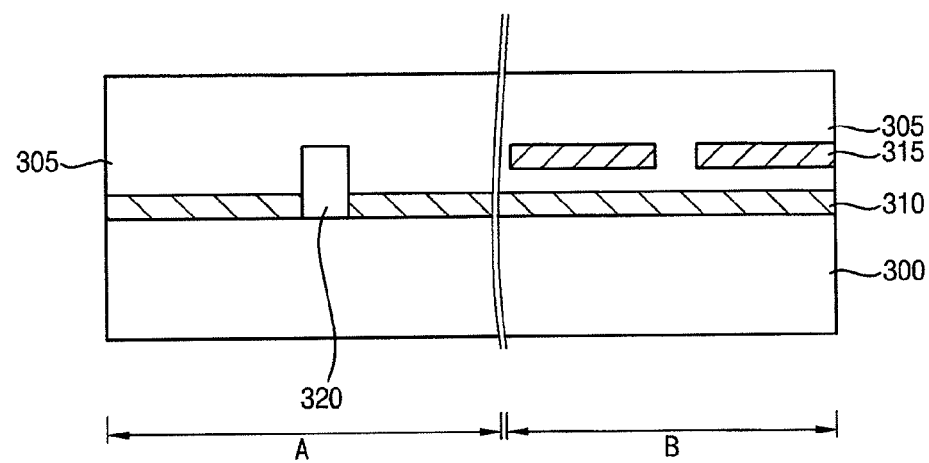

Referring to FIG. 27, a deep N well 320 is formed in the circuit region A. The deep N well 320 functions as a guardring of the circuit region A. A deep N well 315 is formed in the region B.

In an exemplary embodiment, the deep N well 315 in the peripheral circuit region B is formed by implanting phosphorus having a dose of about $4 \times 10^{13}$ using implantation energy of about 1.4 MeV.

The deep N well 320 in the circuit region A is formed by implanting impurities having a dose of about $2 \times 10^{13}$ using implantation energy of about 2 MeV. The deep N well 320 makes contact with the P+ well 310.

The deep N well 315 formed by implanting N type impurities is used as a triple well that provides peripheral circuits with various operational voltages. Here, when the N type semiconductor substrate 300 is used, the distance between the deep N well 315 and the N type semiconductor substrate 300 is very short. This can cause a punchthrough. To prevent the punchthrough, the deep P+ well 310 under the deep N well 315 functions to isolate the deep N well 315 from the N type semiconductor substrate 300.

Further, the deep N well 320 in the circuit region A functions as an electrical passageway through which the thermal electrons generated from the N type semiconductor substrate 300 are rapidly drained. In an exemplary embodiment, because the deep N well 320 is formed through the P+ well 310 under the depletion region, the thermal electrons are more rapidly drained through the operational voltage terminal Vdd.

Figure 28:
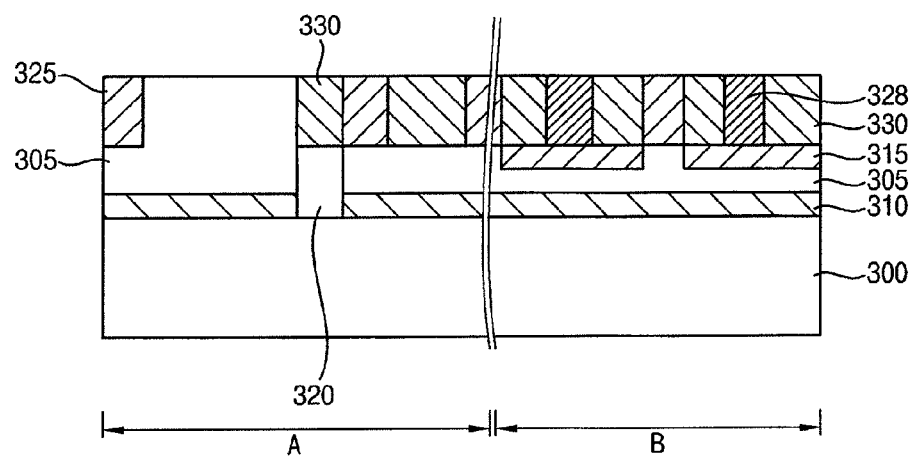

Referring to FIG. 28, shallow P wells 325, 328 are formed in a region of the circuit region A where the sharing circuits are formed except for a region where the photodiode is formed. A shallow N well 330 is formed in a region of the peripheral circuit region B where the peripheral circuits are formed. The shallow P wells 325, 328 and the shallow N well 330 have characteristics in accordance with operations of a CMOS device.

In an exemplary embodiment, to connect the ground terminal GND with the P well 325, the P well 325 is positioned left of the region of the circuit region A where the photodiode is formed. Further, to form the operational voltage terminal Vdd, the shallow N well 330 is located on the deep N well 320.

Various shallow wells are formed in other regions to readily constitute a CMOS circuit. The shallow wells are formed by implanting impurities using masks as an ion implantation mask. Ion implantation energy is substantially similar to that used for forming the deep wells. The shallow N well 330 on the deep N well 320, which function as the guardring of the circuit region A, has a high conductivity.

Figure 29:
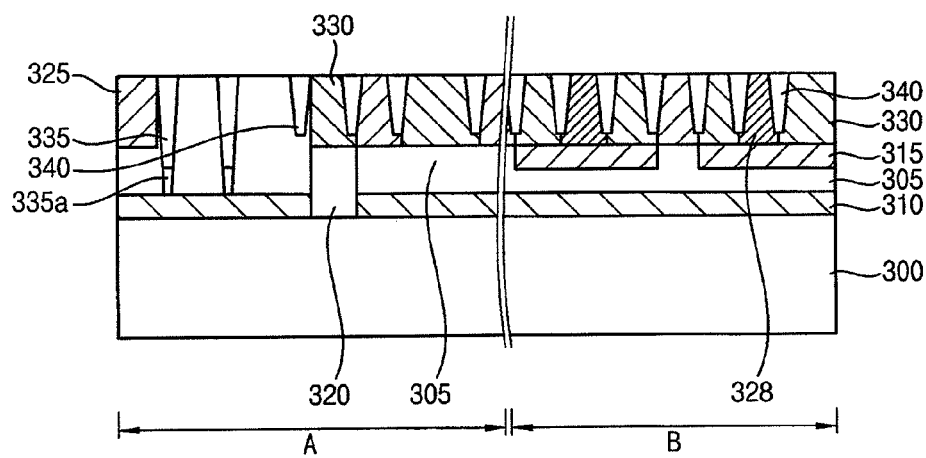

Referring to FIG. 29, isolation layers 335, 340 are formed in regions where the wells and the photodiodes are formed. In an exemplary embodiment, the isolation layer 335 between the photodiodes has a thickness different from that of the isolation layer 340 between other elements.

The isolation layers 335, 340 mainly function to isolate the elements from each other. Here, the elements operate by electrons or holes at surfaces of the semiconductor substrate 300. The photodiodes operate by absorbing blue light, green light and red light in the P− type epitaxial layer 305 to increase accumulation sensitivity of the photodiodes. Here, because red light has a long wavelength of about 0.4 μm to about 5 μm, the photodiodes have a thickness of no less than about 2 μm.

The elements operate and are isolated from each other under a condition that the isolation layer 340 has a thickness of no more than about 2 μm. However, when the isolation layer 335 between the photodiodes has a thickness of no more than about 2 μm, crosstalk between the adjacent pixels is generated. Thus, the isolation layers 335, 340 with a thickness of above about 2 μm are needed. However, this may cause a wide width of the isolation layers 335, 340, so that the device may not be highly integrated any more. Therefore, only the isolation layer 335 between the photodiodes has the thickness greater than that of the isolation layer 340 between the elements.

Further, to increase the sensitivity of the photodiodes by capturing red light absorbed in the semiconductor substrate 300, the photodiodes 350 with a thickness of above about 5 μm are needed. When the photodiodes 350 have a thickness of above about 5 μm, the depletion region is formed in an upper portion of the photodiodes, not a lower portion of the photodiodes that have a thickness of about 5 μm measured from a lower surface of the photodiodes. As mentioned above, the particles, which cause the optical crosstalk, are generated in the depletion region. In contrast, the thermally generated electrons and holes are generated in the outside of the depletion region to cause the electrical crosstalk. To prevent the generation of the crosstalk, the depletion region and the outside of the depletion region are provided with a relatively large size and a relatively small size, respectively. These are accomplished by providing the P− type epitaxial layer 305 with a low concentration and a small size. Further, the deep isolation layer 335 is formed under the depletion region to prevent the generation of the crosstalk.

However, processes for forming the isolation layers having thick thicknesses can be difficult. Thus, according to the exemplary embodiment, the isolation layer 335 between the photodiodes 350 has a thickness different than that of the isolation layer 340 between the elements.

According to the exemplary embodiment, after forming a deep trench, an impurity junction 335a is formed by an ion implantation process. The impurity junction 335a makes contact with the P+ well 310. However, when it is unnecessary to form the deep P+ well 310, the impurity region 335a may correspond to an isolation region formed by a trench formation process. The isolation region makes contact with the P+ well 310. In an exemplary embodiment, the deep isolation layer 335 is located at an outside of the P well 325. Alternatively, the deep isolation layer 335 is positioned in the P well 325 to form a potential barrier that function to prevent electrons being generated by dangling bonds at an interface of a trench for forming the isolation layers.

Figure 30:
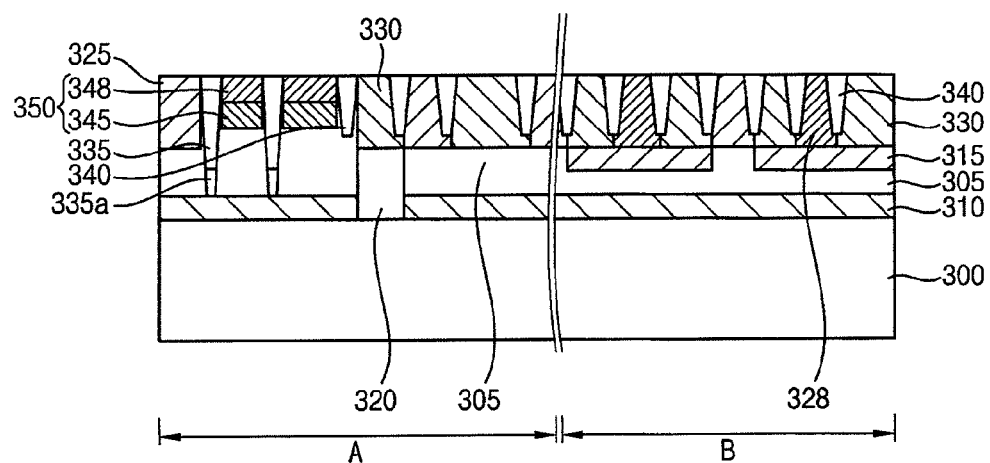

Referring to FIG. 30, the photodiode 350 is formed in the circuit region A. In an exemplary embodiment, because the photodiode 350 has a vertical structure located on the P− type epitaxial layer 305, an N type impurity region 345 and a P type impurity region 348 are sequentially formed to form the photodiode 350. Here, to operate the device, the depletion region is formed between the photodiode 350 and the P− type epitaxial layer 305.

Further, as mentioned above, because the photodiode 350 has improved sensitivity by capturing all of the red light under a condition that the thickness of the photodiode 350 is greater than a maximum wavelength of red light, the N type impurity region is formed in a portion of the photodiode 350 that has a thickness of about 5 μm measured from the lower surface of the photodiode 350 by controlling energy.

The device of the exemplary embodiment having the elements in the circuit region A has following features. To provide the image sensor with improved sensitivity without crosstalk, the light irradiated to the photodiode 350 is accumulated in a corresponding pixel, not an adjacent pixel. That is, the optical crosstalk can be generated by the accumulation of a light in the adjacent pixel, which is selected by a color filter over the photodiode 350, that is refracted in accordance with refractivity and a shape of the semiconductor substrate 200 or an insulating interlayer. To structurally prevent the generation of the optical crosstalk, the deep isolation layer 335 is formed between the photodiodes 350 to prevent the light from being refracted toward the adjacent pixel.

When the deep isolation layer 335 and the impurity junction 335a have a thickness sufficiently greater than that of the photodiode 350 and may also make contact with the P$^+$ type epitaxial layer 310, the accumulation of the light in the adjacent pixel is reduced or not be generated. Thus, the deep isolation layer 335 and the impurity junction 335a may function to primarily prevent the generation of the optical crosstalk.

The electrons and the holes generated in the outside of the depletion region is readily drained through the operational voltage terminal Vdd via the P$^+$ well 310 and the deep N well 320.

The photodiode 350 has a crosstalk-preventive structure having an isolation structure that is formed by combining the deep isolation layer 235, the impurity junction 335a and the deep N well 320. Therefore, the optical crosstalk and the electrical crosstalk are not generated in the photodiode 350 in the circuit region A. As a result, the image sensor has improved sensitivity without noise.

Figure 31:
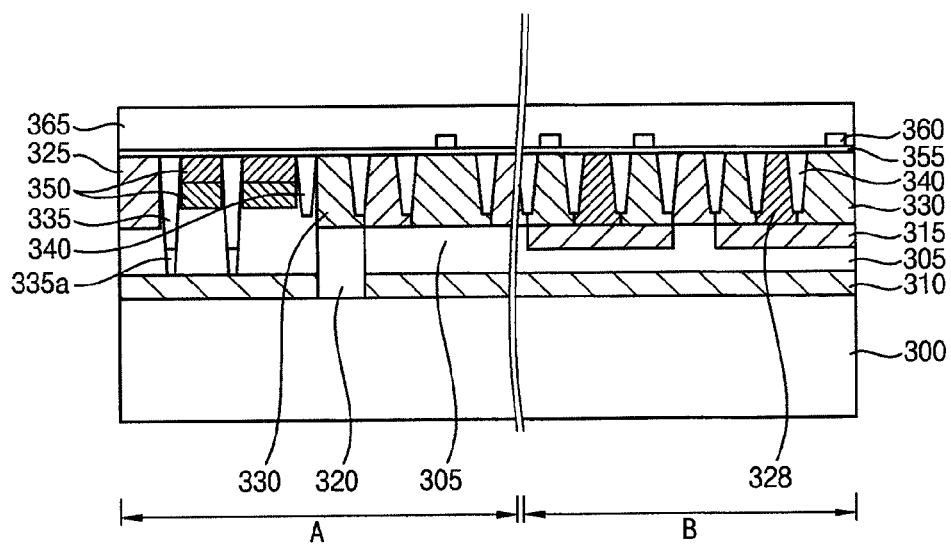

Referring to FIG. 31, a gate insulating layer 355 is formed on the circuit region A and the peripheral circuit region B. Gate electrodes 360 is formed on the gate insulating layer 355. Impurity regions (not shown) is formed at both sides of the gate electrodes 360. A first insulating interlayer 365 is formed on the gate insulating layer 355 to cover the gate electrodes 360.

Figure 32:
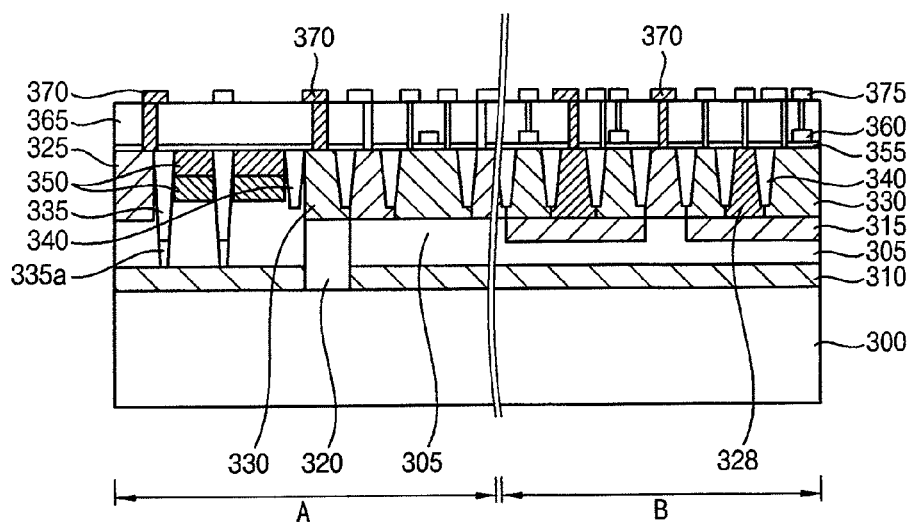

Referring to FIG. 32, first metal wirings 370, 375 are formed on the first insulating interlayer 365. In an exemplary embodiment, the first metal wirings 370, 375 are connected to a gate terminal or source/drain terminals to serve as the ground terminal GND or the operational voltage terminal Vdd.

Figure 33:
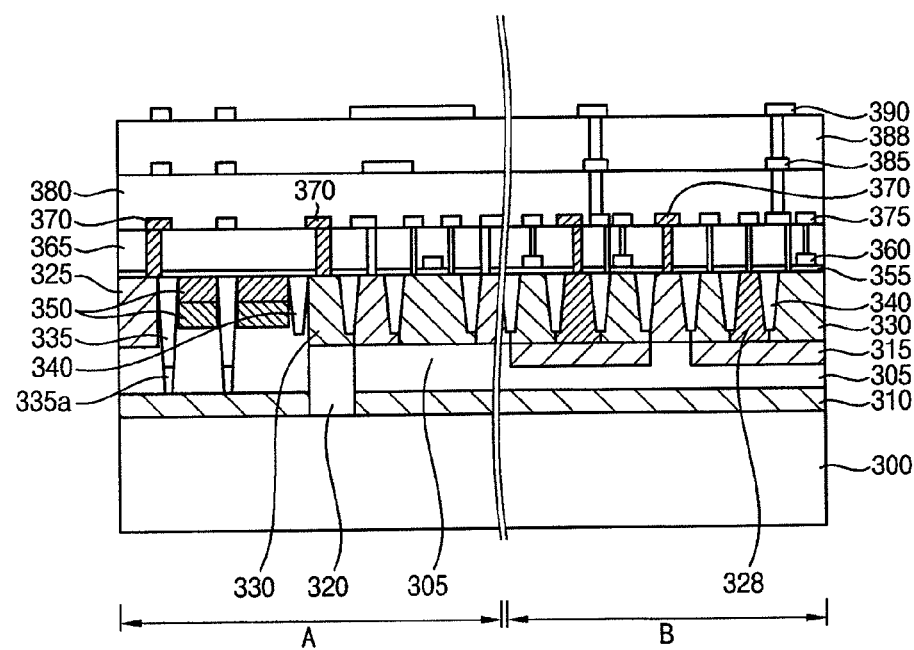

Referring to FIG. 33, after forming the first metal wirings 370, 375 on the first insulating interlayer 365, a second insulating interlayer 380 is formed on the first insulating interlayer 365 to cover the first metal wirings 370, 375. A second metal wiring 385 is formed through the second insulating interlayer 380. The second metal wiring 385 is electrically connected to the first metal wiring 370. A third insulating interlayer 388 is formed on the second insulating interlayer 380 to cover the second metal wiring 385. A third metal wiring 390 is formed through the third insulating interlayer 388. The third metal wiring 390 is electrically connected to the second metal wiring 385.

Figure 34:
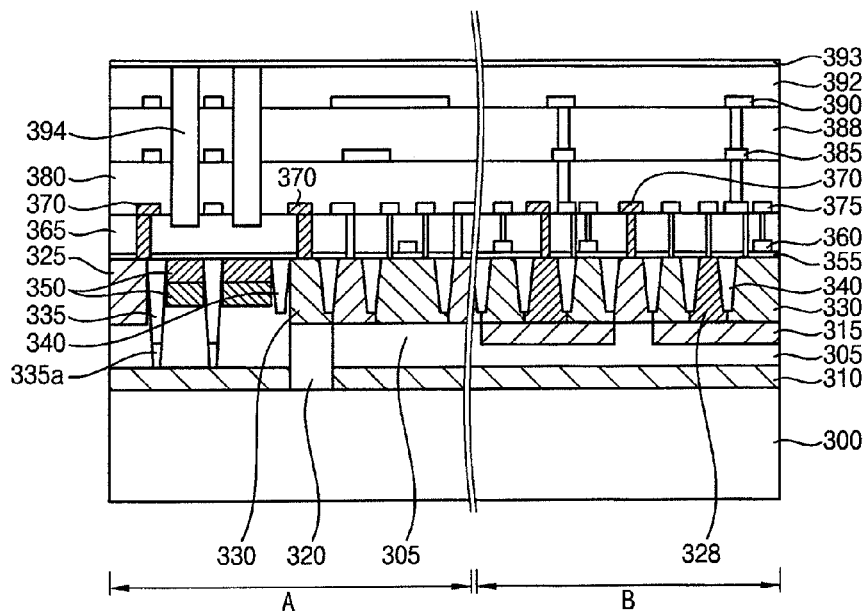

Referring to FIG. 34, a fourth insulating interlayer 392 is formed on the third insulating interlayer 388 to cover the third metal wiring 390. A protecting layer 393 is formed on the fourth insulating interlayer 392. The protecting layer 393, the fourth insulating interlayer 392, the third insulating interlayer 388, the second insulating interlayer 380 and the first insulating interlayer 365 on the photodiode 350 is partially etched to form openings as light transmission passageway. The openings are filled with an oxide layer or a transparent resin layer 394. Here, the first to fourth insulating interlayers 365, 380, 388, 392 have refractivity different from that of the protecting layer 393 due to different materials or uneven surfaces. The transparent resin layer 394 in the openings allows the light to readily pass through the openings under the above-mentioned conditions.

After forming the transparent resin layer 394 in the openings, the transparent resin layer 394 is then planarized to form a color filter layer later.

Figure 35:
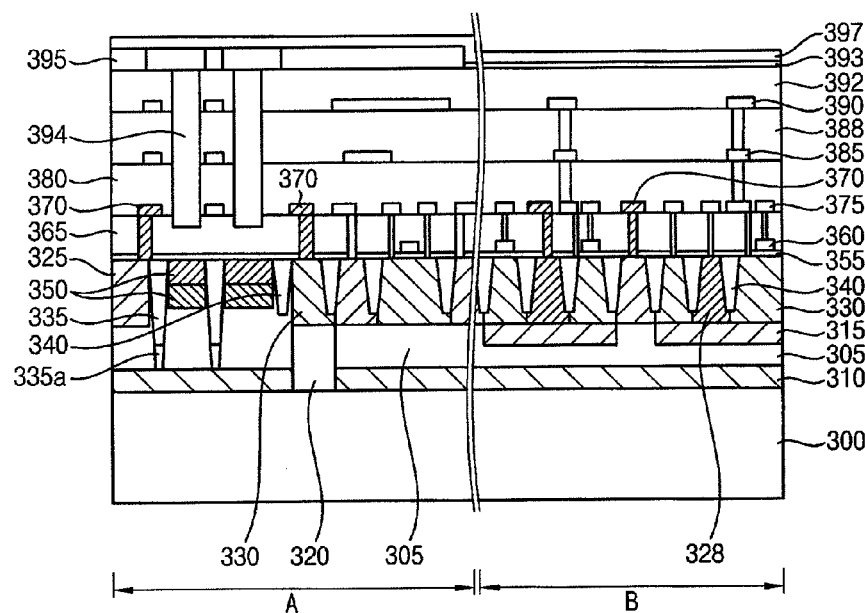

Referring to FIG. 35, the color filter layer 395 is formed on the transparent resin layer 394. Here, in an exemplary embodiment, there are two transparent resin layers 394. Additionally, when the image sensor uses a color filter array having a red color, a green color and a blue color, at least three transparent resin layers 394 and at least three photodiodes 350 are needed.

Here, the color filter layer 395 is needed only in the circuit region A. Thus, a portion of the color filter layer 395 in the peripheral circuit region B is then removed to form a planarization layer 397.

Figure 36:
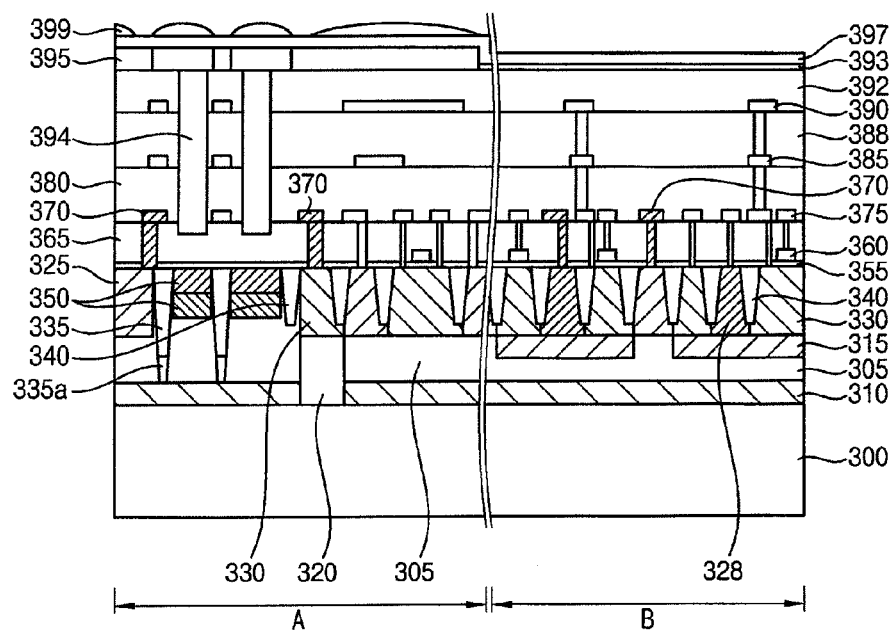

Referring to FIG. 36, a micro lens 399 is formed on the color filter layer 395 and the planarization layer 397.

The color filter layer 395 selectively selects desired colors in the light passing through the micro lens 399. The selected light colors is accumulated in the photodiode 350 through the transparent resin layer 394.

Here, as mentioned above, the selected light colors can overflow the photodiode 350 and are then accumulated in the adjacent pixel under a condition that the first to fourth insulating interlayers 365, 380, 388, 392 make contact with the first to third metal wirings 370, 385, 390 to generate the crosstalk. The crosstalk causes low sensitivity of the image sensor.

However, according to the exemplary embodiment, the deep isolating layer 335, the impurity junction 335a and the P$^+$ well 310 sufficiently isolate the adjacent photodiode 250 to prevent the generation of the optical crosstalk. Further, the thermal electrons generated in the outside of the depletion region are drained through the operational voltage terminal Vdd via the deep N well 320 and the P$^+$ well 310 to prevent the generation of electrical crosstalk. As a result, the CMOS image sensor has improved sensitivity without crosstalk.

Figure 37:
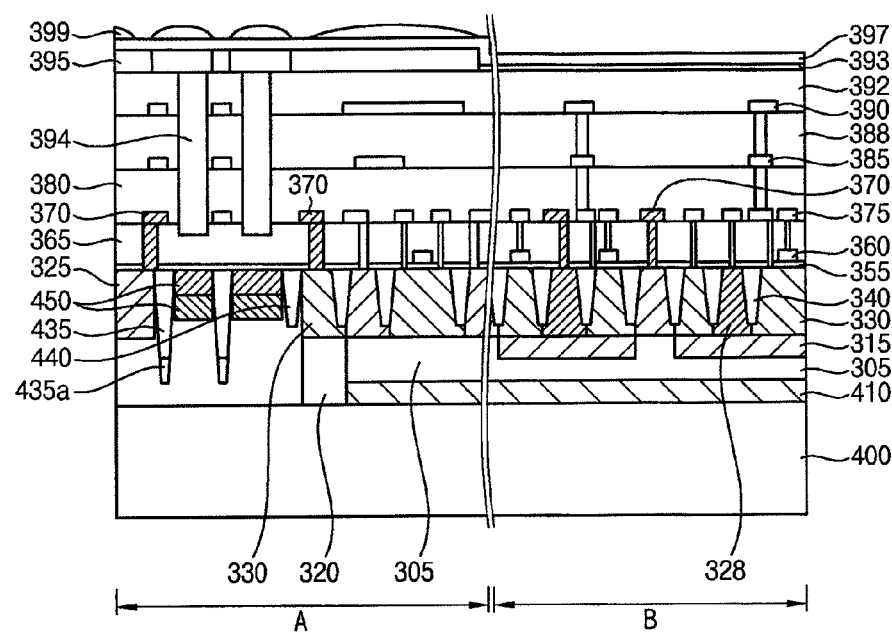
FIGS. 37 and 38 are cross-sectional views illustrating a method of manufacturing a CMOS image sensor in accordance with an exemplary embodiment.
Figure 38:
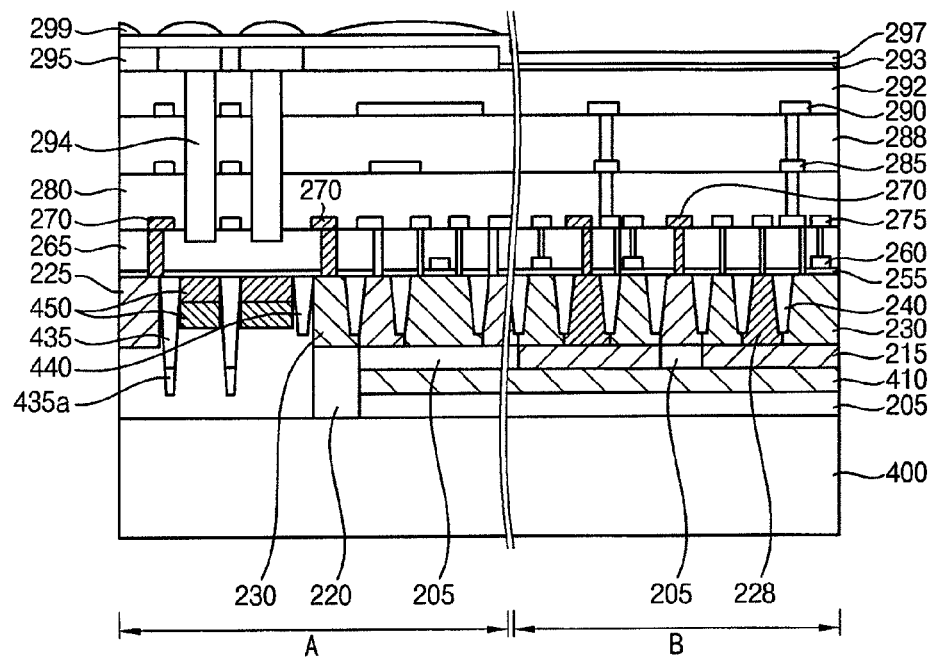

FIGS. 37 and 38 are cross-sectional views illustrating a method of manufacturing a CMOS image sensor in accordance with an exemplary embodiment. A deep isolation layer 435 has a thickness greater than a shallow isolation layer 440. Further, an impurity junction 435a is formed beneath the deep isolation layer 435. A P$^+$ well 410 may not exist in a circuit region A where a photodiode 450 is formed. The P well 410 is formed by an ion implantation process.

Here, a method of manufacturing the image sensor in accordance with the exemplary embodiment is substantially similar to that of manufacturing the image sensor in accordance with the exemplary embodiments depicted in FIGS. 15-36 except that a process for forming the P$^+$ well 410 in the circuit region A is omitted. Thus, any further illustrations with respect to the method are omitted herein for brevity. According to the method of the exemplary embodiment, the circuit region A where the photodiode 450 is formed has a very low impurity concentration. Thus, an isolation structure from a semiconductor substrate 400 is obtained in peripheral circuit region B.

Figure 39:
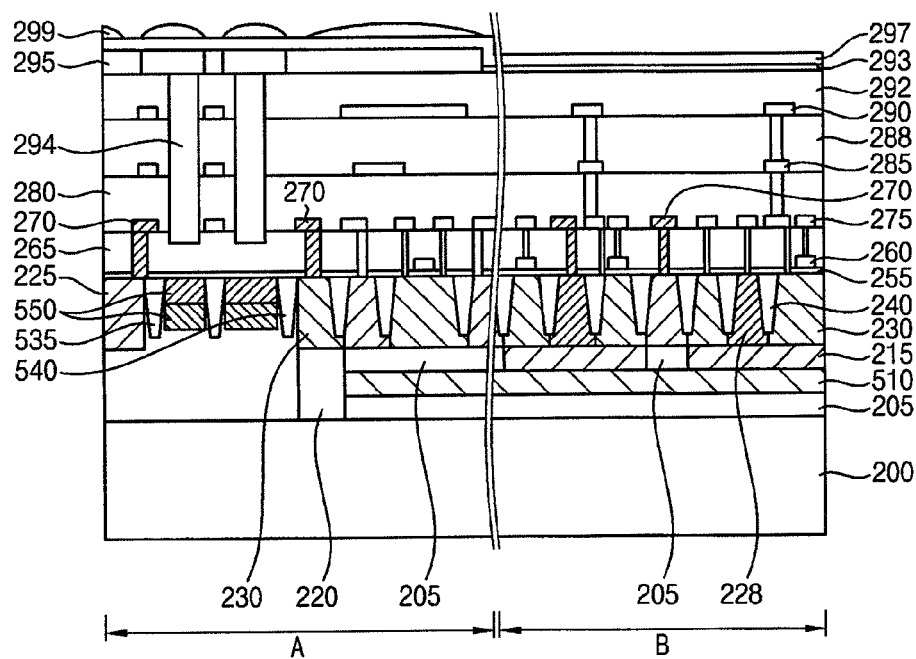
FIGS. 39 and 40 are cross-sectional views illustrating a method of manufacturing a CMOS image sensor in accordance with an exemplary embodiment.
Figure 40:
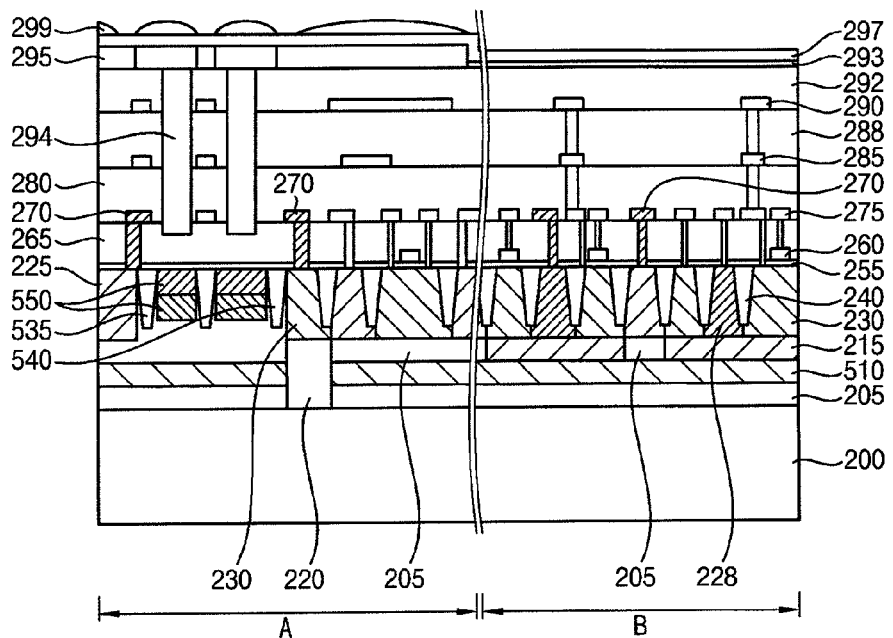

FIGS. 39 and 40 are cross-sectional views illustrating a method of manufacturing a CMOS image sensor in accordance with an exemplary embodiment. Isolation layers 535, 540 have substantially the same thickness. Further, in FIG. 39, a P$^+$ well 510 is formed in a circuit region A where a photodiode 550 is formed. In contrast, in FIG. 40, the P$^+$ well 510 may not be formed in the circuit region A. The P$^+$ well 510 is formed by an ion implantation process. Because the isolation layers 535, 540 have substantially the same thickness, a method of manufacturing the image sensor in accordance with the exemplary embodiment is simplified. Further, the method of the exemplary embodiment is applied when the isolation layers 535, 540 are formed by a single photolithography process and the image sensor has a low integration degree. In this case, the isolation layers 535, 540 is formed under the photodiode 550. Here, the method of manufacturing the image sensor is substantially similar to that in the exemplary embodiments depicted in FIGS. 15-36 except that the isolation layers 535, 540 have substantially the same thickness. Thus, any further illustrations with respect to the method are omitted herein for brevity.

According to the exemplary embodiment, when the image sensor having a low integration degree, which includes the isolation layers 535, 540 is formed under the photodiode 550 by the single process, is manufactured, the $P^+$ well 510 is formed by the ion implantation process under a condition that a mask is slightly controlled to form the image sensors in FIGS. 39 and 40.

Therefore, the image sensors are manufactured by simple processes. Further, the circuit region A where the photodiode 550 is formed has a very low impurity concentration. Furthermore, holes is readily drained a ground terminal GND. An isolation structure from a semiconductor substrate 500 is obtained in a peripheral circuit region B. Moreover, a width of an outside of the depletion region is easily adjusted. Thus, the $P^+$ well 510 is readily formed under the photodiode 510 to facilitate coupling between thermal electrons and holes.

Figure 41:
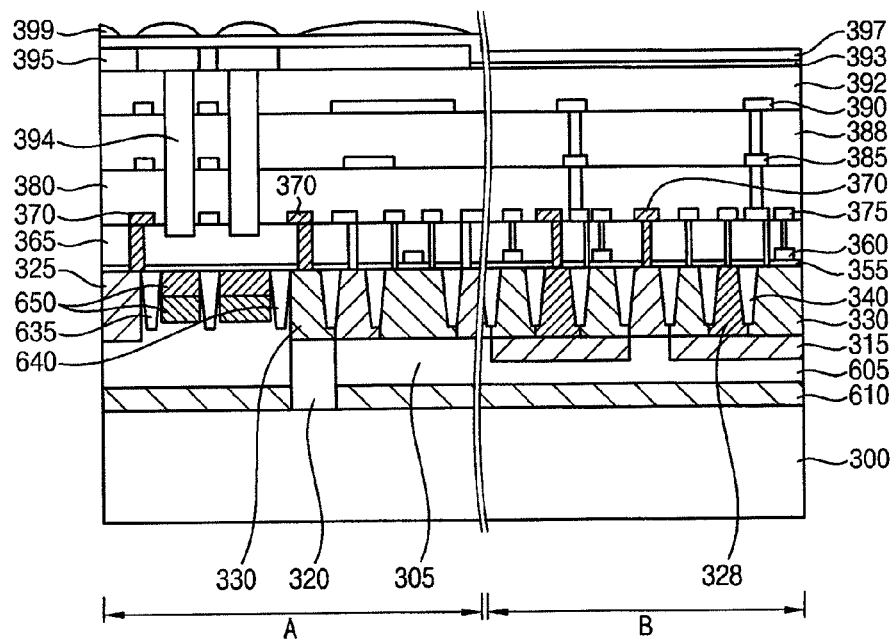
FIG. 41 is a cross-sectional view illustrating a method of manufacturing a CMOS image sensor in accordance with an exemplary embodiment.

FIG. 41 is a cross-sectional view illustrating a method of manufacturing a CMOS image sensor in accordance with an exemplary embodiment. The method of the exemplary embodiment is applied when the isolation layers 635, 640 is formed under a photodiode 650 by a single photolithography process and the image sensor has a low integration degree. Because the isolation layers 635, 640 have substantially the same thickness, the method of manufacturing the image sensor in accordance with the exemplary embodiment is simplified. Further, the method of the exemplary embodiment is advantageously applied to an image sensor having a low integration degree rather than an image sensor having a high integration degree. A $P^+$ type epitaxial layer 610 and a $P^-$ type epitaxial layer 605 is formed by a single process. Further, because the $P^+$ type epitaxial layer 610 and the $P^-$ type epitaxial layer is formed in a single chamber by controlling an impurity concentration, the method is further simplified. Although the isolation layers 635, 640 have substantially the same thickness, the image sensor having a low integration degree has a sufficiently isolating structure and a crosstalk-preventive structure. Here, the method of manufacturing the image sensor is substantially similar to that in the embodiment depicted in FIGS. 39-40. Thus, any further illustrations with respect to the method are omitted herein for brevity. According to the exemplary embodiment, the image sensor having a low integration degree is manufactured by simple processes.

Figure 42:
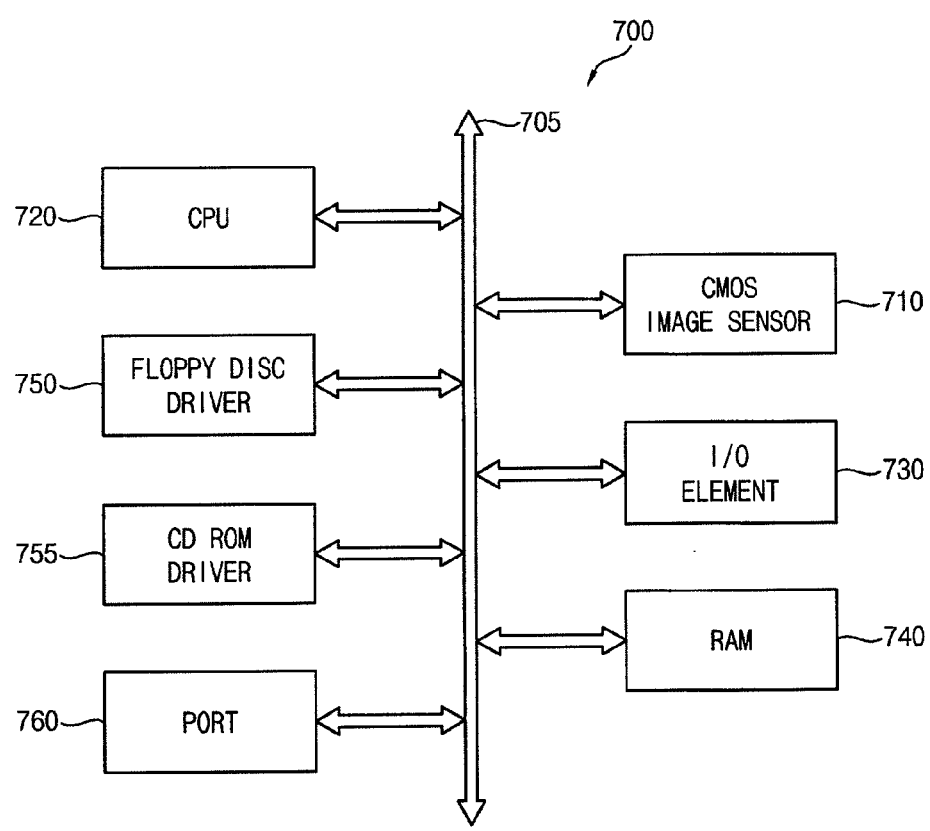
FIG. 42 is a block diagram illustrating a system including the CMOS image sensor of the exemplary embodiments.

FIG. 42 is a block diagram illustrating an exemplary embodiment of a system having the CMOS image sensor of at least one of the exemplary embodiments described above. A system 700 includes a CMOS image sensor 710. The system 700 processes an image outputted from the CMOS image sensor 710. In an exemplary embodiment, the system 700 includes a computer system, a camera system, a scanner, an image stabilizing system, etc.

The system 700 such as the computer system includes a central processing unit (CPU) 720, such as a microprocessor. The microprocessor communicates with an input/output element 730 through a bus 705. A floppy disc driver 750, a CD ROM driver 755, a port 760, a RAM 740 and the CPU 720 are connected with each other through the bus 705 to transfer/receive data to/from each other, so that the image outputted from the CMOS image sensor 710 is displayed.

The port 760 is coupled to a video card, a sound card, a memory card, a USB device, etc. (not shown). Alternatively, the port 760 can communicate data to other systems.

The CMOS image sensor 710 is integrated with the CPU 720, a digital signal processing (DSP) unit or a memory. Alternatively, the CMOS image sensor 710 is integrated independent of the processors.

The system 700 can be used in a camera phone, a digital camera, etc. The CMOS image sensor 710 in the system 700 is manufactured by at least one of exemplary embodiments described herein.

Figure 43:
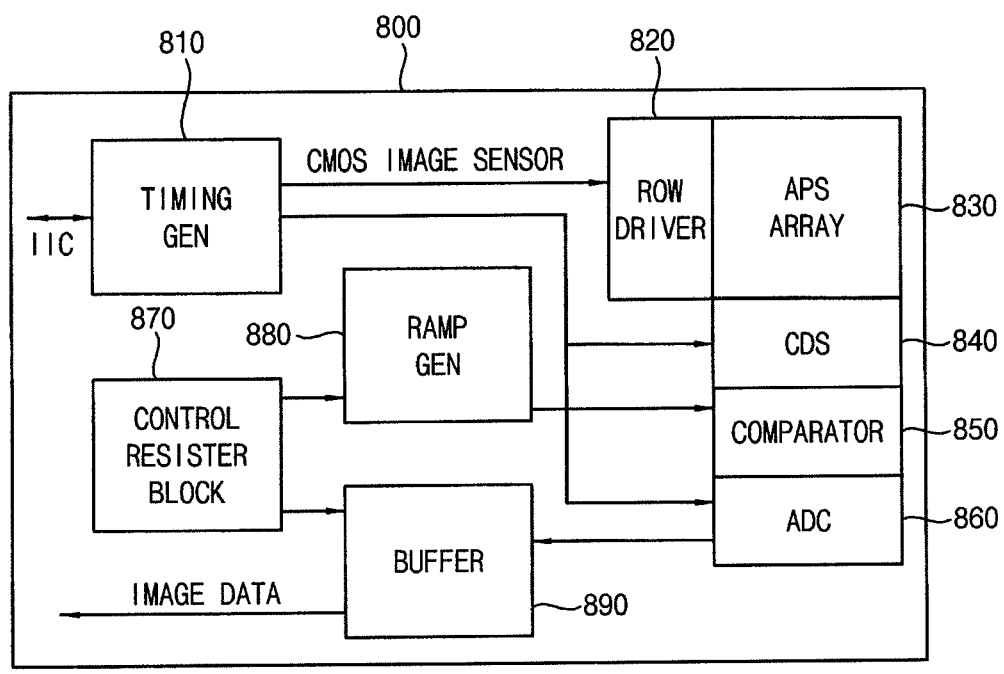
FIG. 43 is a block diagram illustrating the CMOS image sensor chip of the exemplary embodiments.

FIG. 43 is a block diagram illustrating a CMOS image sensor chip implementing at least one of the exemplary embodiments described above. A CMOS image sensor chip 800 includes a timing generator 810, row driver 820, an active pixel sensor (APS) array 830, a correlated double sampling (CDS) 840, a comparator 850, an analog-to-digital converter (ADC) 860, a buffer 890, ramp generator 880 and a control resister block 870.

Light is irradiated to an optical lens of the APS array 830. The light is then converted into electrons. The electrons are amplified into a voltage to remove noise, thereby selecting desired signals. The comparator 850 compares the selected signals with a reference signal to identify the selected signal. The ADC 860 converts the identified signal into a digital image data signal. The digital image data signal passes through a DSP (not shown) to display an image on a system.

According to the exemplary embodiment, the APS array 830 in the image sensor includes the deep isolation layer and deep N wells that prevent the crosstalk.

Figure 44:
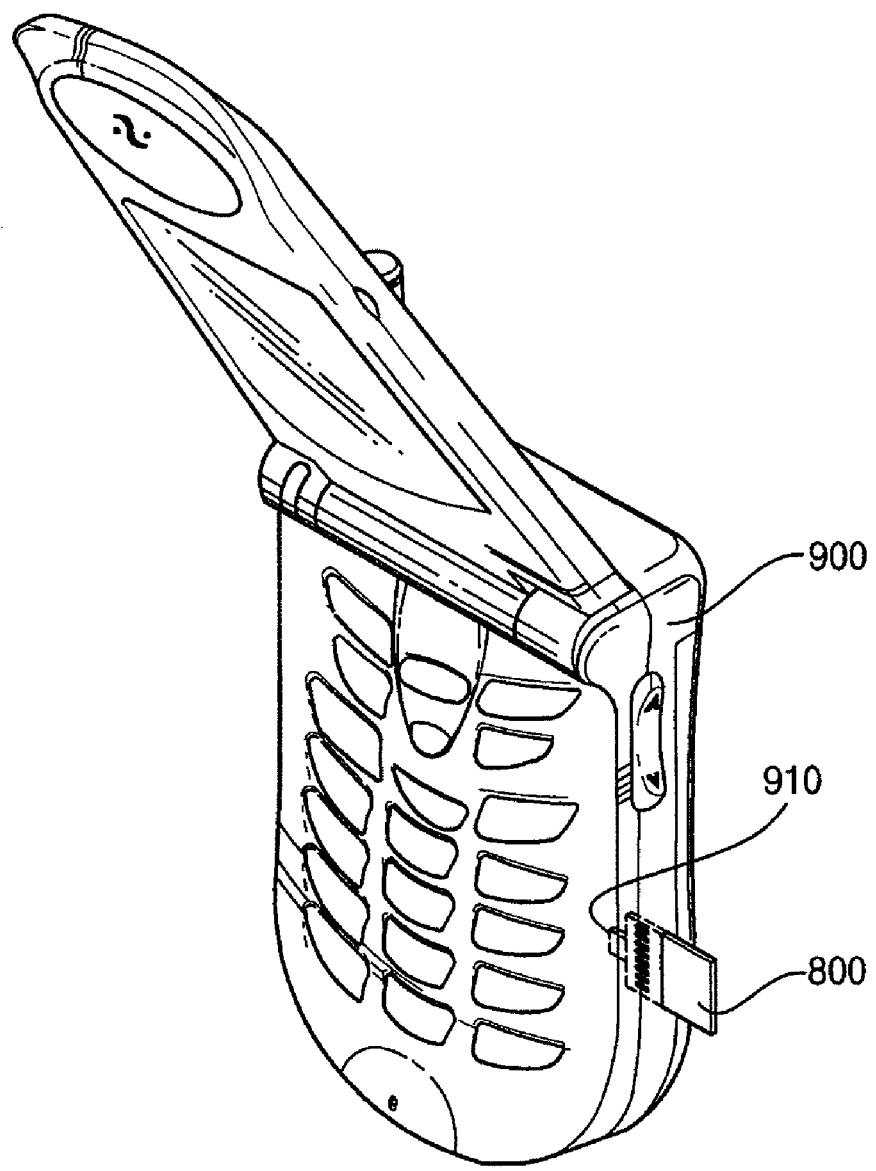
FIG. 44 is a perspective view illustrating a digital camera phone including the CMOS image sensor chip in FIG. 43.

FIG. 44 is a perspective view illustrating an exemplary embodiment of a digital camera phone including the CMOS image sensor chip of FIG. 43. The camera phone 900 includes a DSP 910 in which a controller (not shown) and an image signal processor (not shown) is built. The image sensor chip 800 in the exemplary embodiment is electrically connected with the DSP 910.

The camera phone 900 includes elements substantially the same as those of the system in the exemplary embodiment depicted in FIG. 42. Alternatively, elements can be removed from the system to constitute the camera phone 900. Further, additional elements can be added to the system to constitute the camera phone 900. In the exemplary embodiment, the CMOS image sensor chip 800 is detachably inserted into the camera phone 900. Alternatively, the CMOS image sensor chip 800 is integrally formed with a substrate in the camera phone 900.

According to the exemplary embodiment, the image sensor chip includes the deep isolation layer and deep N wells that may prevent the crosstalk.

Thus, the camera phone 900 including the CMOS image sensor chip, which includes the deep isolation layer and the deep N wells having the crosstalk-preventive structure, has improved sensitivity without crosstalk. As a result, the camera phone 900 displays a clear color image. When the camera phone 900 has a video phone call function, a real picture is displayed.

Figure 45:
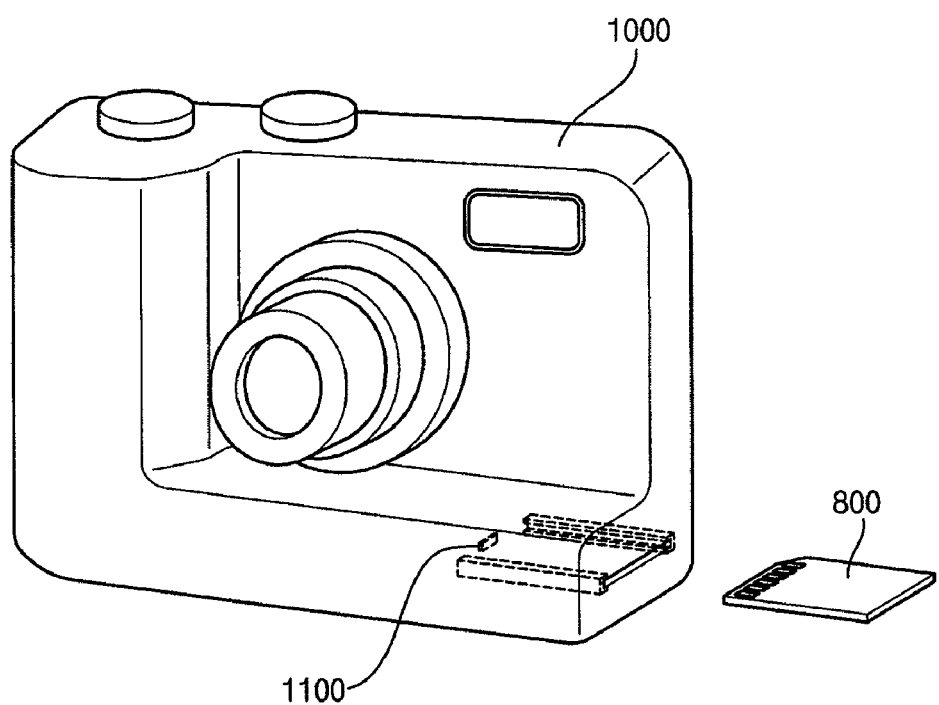
FIG. 45 is a perspective view illustrating a digital camera including the CMOS image sensor chip in FIG. 43.

FIG. 45 is a perspective view illustrating an exemplary embodiment of a digital camera including the CMOS image sensor chip depicted in FIG. 43. A digital camera 1000 includes a DSP 1100 in which a controller (not shown) and an image signal processor (not shown) is built. The image sensor chip 800 in the exemplary embodiment is electrically connected with the DSP 1100.

The digital camera 1000 includes elements substantially the same as those of the system in the exemplary embodiment depicted in FIG. 42. Alternatively, elements can be removed from the system to constitute the digital camera 1000. Further, additional elements can be added to the system to constitute the digital camera 1000. In the exemplary embodiment, the CMOS image sensor chip 800 is detachably inserted into the digital camera 1000. Alternatively, the CMOS image sensor chip 800 is integrally formed with a substrate in the digital camera 1000.

Light is irradiated to an optical lens of an APS array. The light is then converted into electrons. The electrons are amplified into a voltage to remove noise, thereby selecting desired signals. A comparator compares the selected signals with a reference signal to identify the selected signal. An ADC converts the identified signal into a digital image data signal. The digital image data signal passes through a DSP to display an image on an LCD system.

According to an exemplary embodiment, the CMOS image sensor includes the deep isolation layer and deep N wells that prevent crosstalk. Thus, the digital camera 1000 has improved sensitivity without crosstalk, so that a clear image is displayed.

Further, the CMOS image sensor can be applied to a memory card for storing digital image data. Therefore, the digital camera 1000 can replay and edit the digital image data.

According to exemplary embodiments, the CMOS image sensor prevents the crosstalk between adjacent pixels. Thus, a clearly and highly integrated image system is readily manufactured.

Further, the system including the CMOS image sensor can be applied to a memory card using an NAND flash or a NOR flash to store a digital image. Therefore, the digital image can be replayed and edited.

The foregoing is illustrative of exemplary embodiments and is not to be construed as limiting thereof. Although exemplary embodiments have been described, those skilled in the art will readily appreciate that many modifications are possible to the exemplary embodiments and that such modifications, as well as other exemplary embodiments, are intended to be included within the scope of the appended claims.

What is claimed is:

1. A method of manufacturing a CMOS image sensor, the method comprising:
   forming a P type epitaxial layer having a low concentration on an N type substrate that has an active pixel sensor array region and a peripheral circuit region;
   forming a deep P well having a high concentration in the P type epitaxial layer;
   forming a deep N well having a high concentration in a portion of the P type epitaxial layer in the active pixel sensor array region and through the deep P well to make contact with an operational voltage terminal;
   forming an isolation layer that has a first portion in the active pixel sensor array region and a second portion in the peripheral circuit region, the first portion having a thickness different from a thickness of the second portion; and
   a photodiode formed in the active pixel sensor array region isolated by the first portion of the isolation layer.

2. The method of claim 1, wherein forming the isolation layer comprises forming an impurity junction under the first portion.

3. The method of claim 1, wherein the first portion and the second portion of the isolation layer are formed by different photolithography processes.

4. A method of manufacturing a CMOS image sensor, the method comprising:
   forming a first P type epitaxial layer having a high concentration on an N type substrate that has an active pixel sensor array region and a peripheral circuit region;
   forming a second P type epitaxial layer having a low concentration on the first P type epitaxial layer;
   forming a deep N well having a high concentration through the first P type epitaxial layer in the active pixel sensor array region to make contact with an operational voltage terminal;
   forming an isolation layer on the active pixel sensor array region and the peripheral circuit region; and
   a photodiode formed in the active pixel sensor array region isolated by the first portion of the isolation layer.

5. The method of claim 4, wherein forming the isolation layer comprises forming a deep trench.

6. The method of claim 4, further comprising a plurality of transparent resin layers over the active pixel sensor array region.

7. The method of claim 6, further comprising sequentially forming a color filter layer and a plurality of lenses on the transparent resin layers.

8. The method of claim 4, further comprising a plurality of CMOS elements in the peripheral circuit region.

* * * * *